United States Patent
Kim et al.

(10) Patent No.: US 12,382,756 B2
(45) Date of Patent: Aug. 5, 2025

(54) MICRO LIGHT-EMITTING ELEMENT, MICRO LIGHT-EMITTING ELEMENT ARRAY INCLUDING THE MICRO LIGHT-EMITTING ELEMENT, AND DISPLAY DEVICE INCLUDING THE MICRO LIGHT-EMITTING ELEMENT ARRAY

(71) Applicant: SAMSUNG ELECTRONICS CO., LTD., Suwon-si (KR)

(72) Inventors: Hyunjoon Kim, Seoul (KR); Dongkyun Kim, Suwon-si (KR); Dongho Kim, Seoul (KR); Joonyong Park, Suwon-si (KR); Seogwoo Hong, Yongin-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 17/847,637

(22) Filed: Jun. 23, 2022

(65) Prior Publication Data
US 2023/0215979 A1 Jul. 6, 2023

(30) Foreign Application Priority Data
Dec. 27, 2021 (KR) .......... 10-2021-0188988

(51) Int. Cl.
*H01L 33/38* (2010.01)
*H01L 25/075* (2006.01)
(Continued)

(52) U.S. Cl.
CPC ..... *H10H 20/8312* (2025.01); *H01L 25/0753* (2013.01); *H10H 20/84* (2025.01); *H10H 29/142* (2025.01)

(58) Field of Classification Search
None
See application file for complete search history.

(56) References Cited

U.S. PATENT DOCUMENTS

| 8,268,653 | B2 * | 9/2012 | Kim | ........ H01L 33/24 438/46 |
| 9,722,145 | B2 | 8/2017 | Sasaki et al. | |

(Continued)

FOREIGN PATENT DOCUMENTS

| JP | 2018-78279 A | 5/2018 |
| KR | 10-2010-0031880 A | 3/2010 |

(Continued)

OTHER PUBLICATIONS

Delrio, F., et al., "The role of van der Waals forces in adhesion of micromachined surfaces", Nature Publishing Group, vol. 4, Aug. 2005, pp. 629-634.

(Continued)

*Primary Examiner* — Asok K Sarkar
(74) *Attorney, Agent, or Firm* — Sughrue Mion, PLLC

(57) ABSTRACT

A micro light-emitting element includes a first conductivity type semiconductor layer including a lower surface on which an uneven pattern is formed, an active layer provided on the first conductivity type semiconductor layer, a second conductivity type semiconductor layer provided on the active layer, at least one electrode provided on the second conductivity type semiconductor layer, and a transparent coating layer including a first surface covering the lower surface of the first conductivity type semiconductor layer, and a second surface facing the first surface and having a second surface roughness that is less than a first surface roughness of the lower surface of the first conductivity type semiconductor layer.

31 Claims, 48 Drawing Sheets

(51) Int. Cl.
*H10H 20/831* (2025.01)
*H10H 20/84* (2025.01)
*H10H 29/14* (2025.01)

(56) References Cited

U.S. PATENT DOCUMENTS

| | | | |
|---|---|---|---|
| 9,825,202 B2 | 11/2017 | Schuele et al. | |
| 9,917,226 B1 | 3/2018 | Heine et al. | |
| 10,243,097 B2 | 3/2019 | Yuen | |
| 10,418,527 B2 | 9/2019 | Sasaki et al. | |
| 10,475,958 B2 | 11/2019 | Zhan et al. | |
| 10,516,084 B2 | 12/2019 | Sasaki et al. | |
| 10,825,702 B2 | 11/2020 | Shim et al. | |
| 2020/0328197 A1* | 10/2020 | Han | H01L 33/52 |
| 2021/0057607 A1 | 2/2021 | Lin et al. | |
| 2021/0066551 A1 | 3/2021 | Xiong et al. | |
| 2022/0189810 A1 | 6/2022 | Hwang et al. | |
| 2022/0246796 A1 | 8/2022 | Kim et al. | |
| 2023/0061671 A1 | 3/2023 | Yang et al. | |
| 2023/0133466 A1 | 5/2023 | Hwang et al. | |
| 2024/0145443 A1 | 5/2024 | Schuele et al. | |

FOREIGN PATENT DOCUMENTS

| | | |
|---|---|---|
| KR | 10-2020-0014866 A | 2/2020 |
| KR | 10-2023-0061031 A | 5/2023 |

OTHER PUBLICATIONS

Singh, S., et al., "Enhancement of light extraction efficiency of vertical LED with patterned graphene as current spreading layer", Superlattices and Microstructures, vol. 89, 2016, pp. 89-96.

Cech, J., et al., "Surface roughness reduction using spray-coated hydrogen silsesquioxane reflow", Applied Surface Science, vol. 280, 2013, pp. 424-430.

Communication dated Jun. 19, 2024, issued by the Korean Patent Office in Korean Application No. 10-2021-0188988.

\* cited by examiner

MICRO LIGHT-EMITTING ELEMENT, MICRO LIGHT-EMITTING ELEMENT ARRAY INCLUDING THE MICRO LIGHT-EMITTING ELEMENT, AND DISPLAY DEVICE INCLUDING THE MICRO LIGHT-EMITTING ELEMENT ARRAY

CROSS-REFERENCE TO RELATED APPLICATION

This application is based on and claims priority under 35 U.S.C. § 119 to Korean Patent Application No. 10-2021-0188988, filed on Dec. 27, 2021, in the Korean Intellectual Property Office, the disclosure of which is incorporated by reference herein in its entirety.

BACKGROUND

1. Field

The disclosure relates to micro light-emitting element, micro light-emitting element array including the micro light-emitting element, and display device including the micro light-emitting element array, and more particularly, to micro light-emitting element array having a structure in which a plurality of micro light-emitting elements are bonded to a substrate.

2. Description of the Related Art

Light-emitting diodes (LEDs) have advantages of low power consumption and eco-friendliness. Due to these advantages, industrial demand for the LEDs is increasing. LEDs have been applied to display devices as well as lighting devices and liquid crystal display (LCD) backlights.

On the other hand, a display device using a micro-scale light-emitting element is being developed. In manufacturing a micro light-emitting element display device, a process of transferring a micro light-emitting element to a substrate is required. As a method of transferring a micro light-emitting element, a pick and place method is widely used. However, in the case of using this method, as the size of the micro light-emitting element is small and since the size of the display increases, the productivity thereof decreases. Moreover, transferring the micro light-emitting element that emits colors of light takes a lot of time because transfer processes are further necessary by as many as the number of colors.

In addition, as an area of a light-emitting element of a display device increases, the area of a driving circuit board, to which the micro light-emitting element is to be transferred, also increases. If the transfer process of the micro light-emitting element is further increased to form a large-area display device, more time and cost may be incurred in manufacturing the display device. Accordingly, there is a need for a method of efficiently transferring a micro light-emitting element to a driving circuit board.

In a related art method of transferring a micro light-emitting element to a driving circuit board, various wet and dry transfer techniques may be used. The related art transfer techniques are, for example, wet transfer technology that transfers a micro light-emitting element to a desired position on a driving circuit board by using surface tension of a liquid, wet transfer technology using a laminar flow generated by perturbation through solution pumping, etc., dry transfer technology that transfers the micro light-emitting element to a desired position on the driving circuit board by using an ultrasonic vibrator, vibration of a diaphragm, etc., or using an electric or magnetic field. When using these various wet and dry transfer techniques, a plurality of micro light-emitting elements may be aligned on a mold substrate. In addition, the micro light-emitting elements may be directly aligned on a driving circuit board including an electrode structure instead of the mold substrate.

In this way, when transferring a plurality of micro light-emitting elements to a substrate by using such various types of transfer methods, if lower surfaces of the micro light-emitting elements in contact with the substrate are formed to have a surface roughness of several nm or less based on a root mean square (RMS) roughness, due to adhesive force acting between the micro light-emitting element and the substrate, the micro light-emitting elements are not easily separated from the substrate even by external stimuli (vibration/tilting/pushing, etc.), and as a result, a high transfer yield of the micro light-emitting element may be obtained.

However, when the lower surfaces of the micro light-emitting elements have a low surface roughness of several nm or less, if an incident angle of light emitted from an active layer of the micro light-emitting element on the lower surface of the micro light-emitting element deviates from a critical incidence angle, the light may not be output to the outside due to a total reflection on the lower surfaces of the micro light-emitting elements, and may re-enter inside thereof. Accordingly, as a result, the light extraction efficiency of the micro light-emitting element may be reduced.

SUMMARY

Provided are micro light-emitting element arrays capable of improving light extraction efficiency and transfer yield by increasing adhesion between the micro light-emitting element and a substrate.

Provided are methods of manufacturing micro light-emitting element arrays having high light extraction efficiency and high adhesion between the micro light-emitting element and a substrate.

Additional aspects will be set forth in part in the description which follows and, in part, will be apparent from the description, or may be learned by practice of the presented embodiments of the disclosure.

According to an aspect of the disclosure, there is provided a micro light-emitting element including a first conductivity type semiconductor layer including a lower surface on which an uneven pattern is formed, the lower surface of the first conductivity type semiconductor layer having a first surface roughness, an active layer provided on the first conductivity type semiconductor layer, a second conductivity type semiconductor layer provided on the active layer, at least one electrode provided on the second conductivity type semiconductor layer and a transparent coating layer including a first surface covering the lower surface of the first conductivity type semiconductor layer, and a second surface facing the first surface and having a second surface roughness that is less than the first surface roughness.

The second surface roughness may be 5 nm or less.

The transparent coating layer may include one of polyimide (PI), spin-on-glass (SOG), photoresist, silicon oxide, or silicon nitride.

The transparent coating layer may have a light transmittance of 80% or more.

The transparent coating layer may have a refractive index value between 1 and 2.

The first conductivity type semiconductor layer, the active layer, and the second conductivity type semiconductor layer each may include one of GaN, InN, AlN, InGaN, AlGaN, InAlGaN, AlInN, AlGaAs, InGaAs, AlInGaAs, GaP, AlGaP, InGaP, AlInGaP, or InP.

A first electrode and a second electrode may be provided on the second conductivity type semiconductor layer, and the first electrode and the second electrode may be spaced apart from each other.

The first electrode may have a ring shape corresponding to an edge of the upper surface of the second conductivity type semiconductor layer, and wherein the second electrode may be surrounded by the first electrode.

At least one of a plurality of nanobeads or a plurality of nanopores may be formed inside the transparent coating layer.

An engraved nano-pattern may be formed on the second surface of the transparent coating layer.

According to an aspect of the disclosure, there is provided a micro light-emitting element including: a first conductivity type semiconductor layer including a lower surface on which an uneven pattern is formed, the lower surface of the first conductivity type semiconductor layer having a first surface roughness, an active layer provided on the first conductivity type semiconductor layer, a second conductivity type semiconductor layer provided on the active layer, at least one electrode provided on the second conductivity type semiconductor layer and a transparent coating layer including a first surface covering an upper surface of the second conductivity type semiconductor layer, and a second surface facing the first surface and having a second surface roughness that is less than the first surface roughness.

A hole exposing at least a portion of the at least one electrode may be formed in the second surface.

The transparent coating layer may have a first thickness that is greater than a second thickness of the at least one electrode.

The second surface roughness may be 5 nm or less.

According to an aspect of the disclosure, there is provided a micro light-emitting element array including: a plurality of micro light-emitting elements, each of the plurality of micro light-emitting elements including: a micro light-emitting structure including a first surface on which an electrode is provided, and a second surface facing the first surface, the second surface including an uneven pattern having a first surface roughness, and a transparent coating layer including a third surface covering the second surface, and a fourth surface facing the third surface and having a second surface roughness that is less than the first surface roughness, and a substrate including an upper surface having a first region in which the plurality of micro light-emitting elements are provided and a second region surrounding the first region.

The second surface roughness may be 5 nm or less.

The micro light-emitting structure included in each of the plurality of micro light-emitting elements may include a structure in which a first conductivity type semiconductor layer, an active layer, and a second conductivity type semiconductor layer are sequentially stacked, and wherein the first surface of the micro light-emitting structure is an upper surface of the second conductivity type semiconductor layer, and the second surface of the micro light-emitting structure is a lower surface of the first conductivity type semiconductor layer.

The substrate includes a transfer substrate including a plurality of grooves formed in the upper surface of the substrate, and each of the plurality of micro light-emitting elements is arranged so that the first surface of the micro light-emitting structure faces an upper opening of the plurality of grooves, and the fourth surface of the transparent coating layer is in contact with bottoms of the plurality of grooves.

The substrate may include a transfer substrate including a plurality of hydrophilic regions formed on the upper surface of the substrate and a hydrophobic region surrounding the plurality of hydrophilic regions, and wherein each of the plurality of micro light-emitting elements is arranged so that the fourth surface of the transparent coating layer is in contact with the plurality of hydrophilic regions.

The substrate may include a driving circuit board including a plurality of grooves formed in the upper surface of the substrate and a plurality of electrode structures respectively provided in the plurality of grooves, and wherein each of the plurality of micro light-emitting elements is arranged so that the electrode of each of the plurality of micro light-emitting elements provided on the first surface are respectively in contact with the plurality of electrode structures provided in the plurality of grooves, and the fourth surface faces upper openings of the plurality of grooves.

The substrate may include a driving circuit board including a plurality of electrode structures respectively provided in a plurality of element regions separated from each other on the upper surface thereof, and wherein each of the plurality of micro light-emitting elements is arranged so that the electrode of each of the plurality of micro light-emitting elements provided on the first surface is in contact with the plurality of electrode structures provided in the plurality of element regions.

According to an aspect of the disclosure, there is provided a micro light-emitting element array including: a plurality of micro light-emitting elements, each of the plurality of micro light-emitting elements including: a micro light-emitting structure including a first surface on which an electrode is provided and a second surface facing the first surface, the second surface including an uneven pattern having a first surface roughness, and a transparent coating layer including a third surface covering the first surface and a fourth surface facing the third surface and having a second surface roughness that is less than the first surface roughness; and a substrate including an upper surface having a first region in which the plurality of micro light-emitting elements are provided and a second region surrounding the first region.

A hole exposing at least a portion of the electrode may be formed in the fourth surface.

The substrate may include a driving circuit board including a plurality of grooves formed in the upper surface of the substrate and a plurality of electrode structures provided in the plurality of grooves, and wherein each of the plurality of micro light-emitting elements is arranged so that the fourth surface faces the plurality of electrode structures provided in the plurality of grooves and the second surface faces upper openings of the plurality of grooves.

The substrate may include a driving circuit board including a plurality of hydrophilic regions formed on the upper surface of the substrate, a hydrophobic region surrounding the plurality of hydrophilic regions, and a plurality of electrode structures provided in the plurality of hydrophilic regions, and wherein each of the plurality of micro light-emitting elements is arranged so that the fourth surface faces the plurality of electrode structures provided in the plurality of hydrophilic regions.

According to an aspect of the disclosure, there is provided a display device including: a pixel array including a plurality of micro light-emitting elements, a driving circuit configured to drive the pixel array, and a processor configured to control the operation of the driving circuit; wherein each of the plurality of micro light-emitting element including: a first conductivity type semiconductor layer including a lower surface on which an uneven pattern is formed, the lower surface of the first conductivity type semiconductor layer having a first surface roughness, an active layer provided on the first conductivity type semiconductor layer, a second conductivity type semiconductor layer provided on the active layer, at least one electrode provided on the second conductivity type semiconductor layer and a transparent coating layer including a first surface covering the lower surface of the first conductivity type semiconductor layer, and a second surface facing the first surface and having a second surface roughness that is less than the first surface roughness.

According to an aspect of the disclosure, there is provided a display device including: a pixel array including a plurality of micro light-emitting elements, a driving circuit configured to drive the pixel array and a processor configured to control the operation of the driving circuit, wherein each of the plurality of micro light-emitting element includes: a first conductivity type semiconductor layer including a lower surface on which an uneven pattern is formed, the lower surface of the first conductivity type semiconductor layer having a first surface roughness, an active layer provided on the first conductivity type semiconductor layer, a second conductivity type semiconductor layer provided on the active layer, at least one electrode provided on the second conductivity type semiconductor layer and a transparent coating layer including a first surface covering an upper surface of the second conductivity type semiconductor layer, and a second surface facing the first surface and having a second surface roughness that is less than the first surface roughness.

The second surface roughness may be 5 nm or less.

According to an aspect of the disclosure, there is provided a micro light-emitting element including: a first conductivity type semiconductor layer including a lower surface on which an uneven pattern is formed, the lower surface of the first conductivity type semiconductor layer having a first characteristic configured to apply a first Van der Waals force, an active layer provided on the first conductivity type semiconductor layer, a second conductivity type semiconductor layer provided on the active layer; at least one electrode provided on the second conductivity type semiconductor layer and a transparent coating layer including: a first surface covering one of the lower surface of the first conductivity type semiconductor layer or an upper surface of the second conductivity type semiconductor layer, and a second surface having a second characteristic configured to apply a second Van der Waals force greater than the first Van der Waals force.

The first characteristic may be a first surface roughness of the lower surface of the first conductivity type semiconductor layer, and the second characteristic may be a second surface roughness of the second surface of the transparent coating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
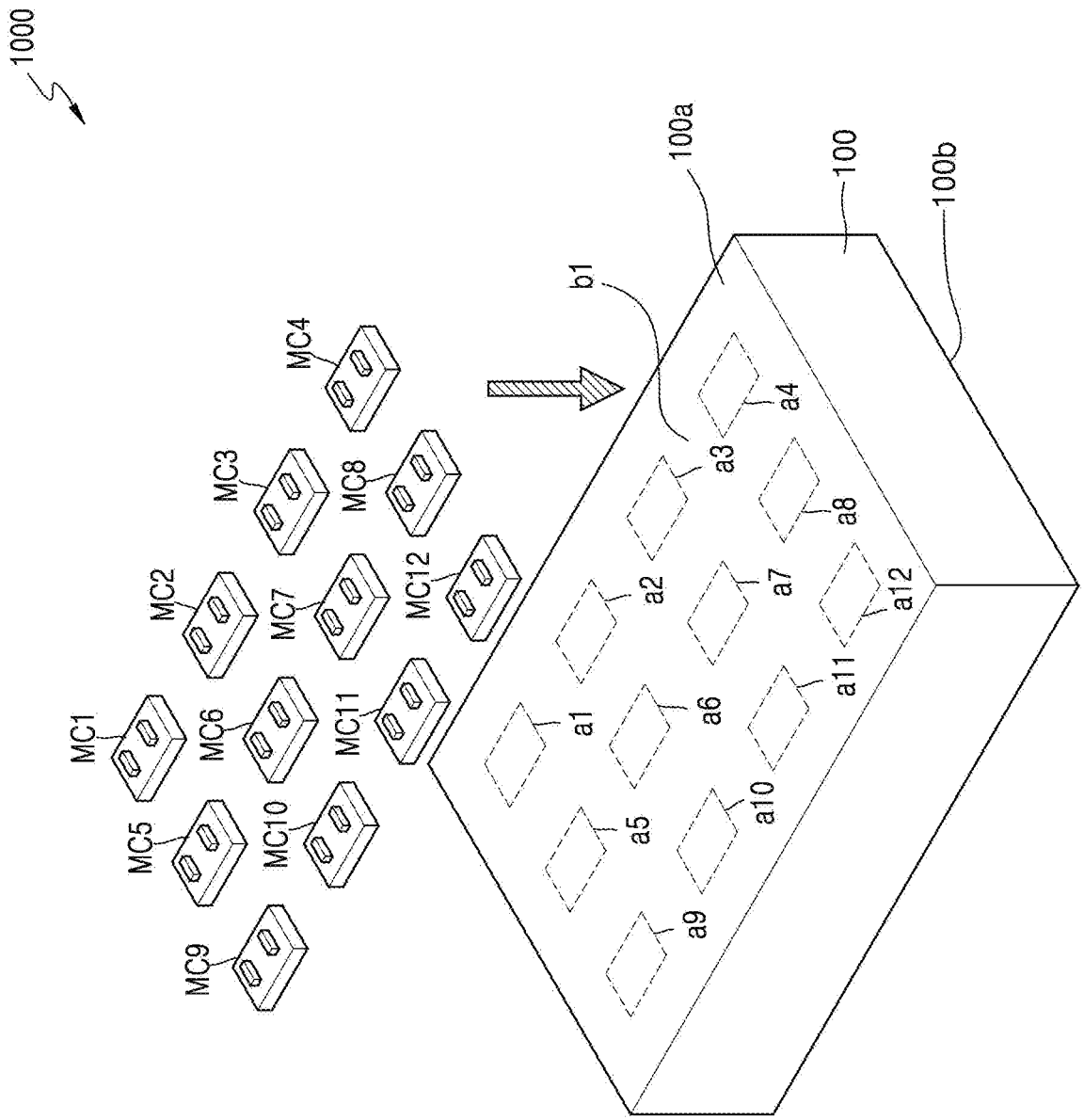
FIG. 1 is a perspective view for explaining a case in which a plurality of micro light-emitting elements are mounted on a substrate according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the size of each component may be exaggerated for clarity and convenience of explanation.

It will be understood that, although the terms "first", "second", etc. may be used herein to describe various elements, these elements should not be limited by these terms. These terms are only used to distinguish one element from another.

When an element or layer is referred to as being "on" or "above" another element or layer, the element or layer may be directly on another element or layer or intervening elements or layers. In the following descriptions, the singular forms include the plural forms unless the context clearly indicates otherwise.

In the entire specification, when a part "comprises" or "includes" an element in the specification, unless otherwise defined, it is not excluding other elements but may further include other elements.

The term "above" and similar directional terms may be applied to both singular and plural. The use of all examples or example terms is merely for describing the technical scope of the inventive concept in detail, and thus, the scope of the inventive concept is not limited by the examples or the example terms as long as it is not defined by the claims.

Figure 2:
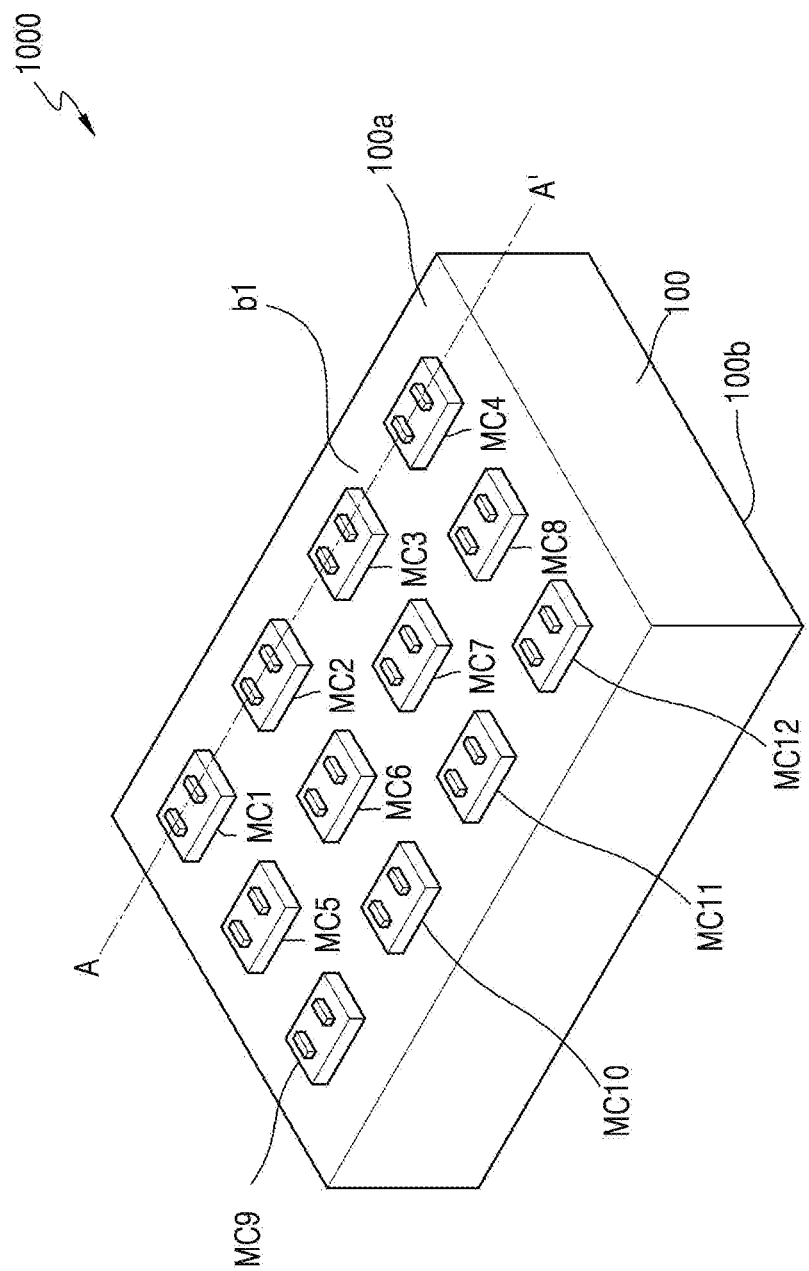
FIG. 2 is a perspective view schematically illustrating a configuration of a micro light-emitting element array according to an example embodiment.
Figure 3:
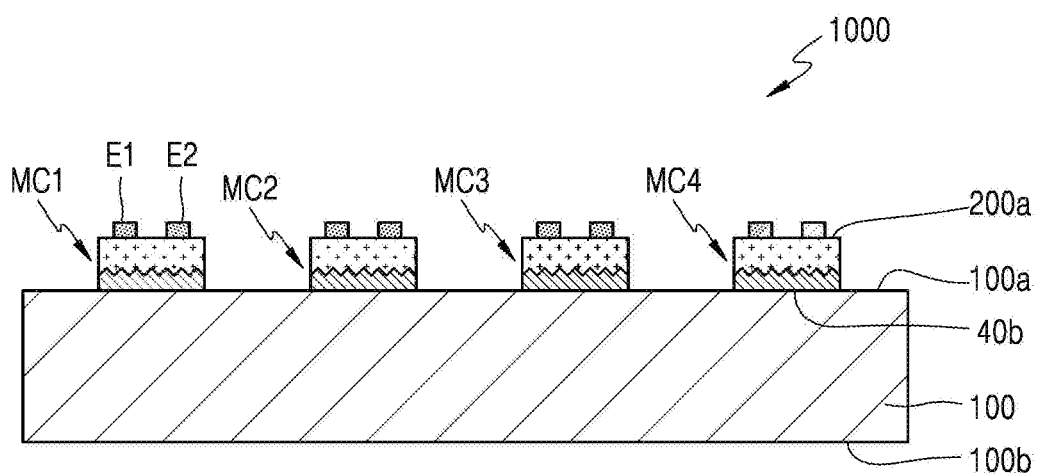
FIG. 3 is a lateral cross-sectional view taken along line A-A' of the micro light-emitting element array of FIG. 2.

FIG. 1 is a perspective view for explaining a case in which a plurality of micro light-emitting elements MC1 to MC12 are mounted on a substrate 100 according to an example embodiment. FIG. 2 is a perspective view schematically illustrating a configuration of a micro light-emitting element array 1000 according to an example embodiment. FIG. 3 is a lateral cross-sectional view of the micro light-emitting element array 1000 of FIG. 2.

Referring to FIGS. 1 and 2, the plurality of micro light-emitting elements MC1 to MC12 are mounted on the substrate 100 to form the micro light-emitting element array 1000. For example, the substrate 100 may be a transfer substrate including an upper surface 100a, on which a plurality of micro light-emitting elements MC1 to MC12 are provided, and a lower surface 100b opposite to the upper surface 100a. FIGS. 1 and 2 show that the number of micro light-emitting elements MC1 to MC12 is 12, but the disclosure is not limited thereto. For example, an innumerable plurality of micro light-emitting elements MCs may be provided on the substrate 100.

The upper surface 100a of the substrate 100 may include hydrophilic regions a1 to a12, in which a plurality of micro light-emitting elements MC1 to MC12 are respectively provided, and a hydrophobic region b1 surrounding the hydrophilic regions a1 to a12. Here, the hydrophilic regions a1 to a12 may be referred to as a first region, and the hydrophobic region b1 may be referred to as a second region.

For example, the hydrophilic regions a1 to a12 may be a plurality of hydrophilic regions separated from each other. In this case, the hydrophilic regions a1 to a12 may include a first hydrophilic region a1, a second hydrophilic region a2, a third hydrophilic region a3, a fourth hydrophilic region a4, a fifth hydrophilic region a5, a sixth hydrophilic region (a6), a seventh hydrophilic region (a7), an eighth hydrophilic region (a8), a ninth hydrophilic region (a9), a tenth hydrophilic region (a10), an eleventh hydrophilic region (a11), and a twelfth hydrophilic region a12. Although the number of hydrophilic regions is illustrated in FIG. 1 as 12, the number of hydrophilic regions is not limited thereto, and the number of hydrophilic regions may be infinitely large.

The hydrophobic region b1 of the upper surface 100a of the substrate 100 may be a region surrounding the plurality of hydrophilic regions a1 to a12 separated from each other. In this case, the plurality of hydrophilic regions a1 to a12 may be provided separate from each other on the substrate 100 and surrounded by the hydrophobic region b1.

FIG. 3 is a lateral cross-sectional view taken along line A-A' of the micro light-emitting element array of FIG. 2 according to an example embodiment. Referring to FIG. 3, each of the plurality of micro light-emitting elements MC1, MC2, MC3, and MC4 arranged on the substrate 100 may include at least two electrodes E1 and E2. According to an example embodiment, the at least two electrodes E1 and E2 may be provided on a first surface 200a of each of the plurality of micro light-emitting elements MC1, MC2, MC3, and MC4. Moreover, each of the plurality of micro light-emitting elements MC1, MC2, MC3, and MC4 may be arranged so that a fourth surface 40b facing the first surface 200a, on which, at least two electrodes E1 and E2 are provided, is in contact with a corresponding region of the hydrophilic regions a1 to a4 of the substrate 100. For example, each of the plurality of micro light-emitting elements MC1, MC2, MC3, and MC4 may be arranged so that a fourth surface 40b of each of the plurality of micro light-emitting elements MC1, MC2, MC3, and MC4 contacts a corresponding region of the plurality of hydrophilic regions a1 to a4.

Hereinafter, a configuration of any one of the plurality of micro light-emitting elements MC1 to MC12 will be described with reference to FIGS. 4 and 5.

Figure 4:
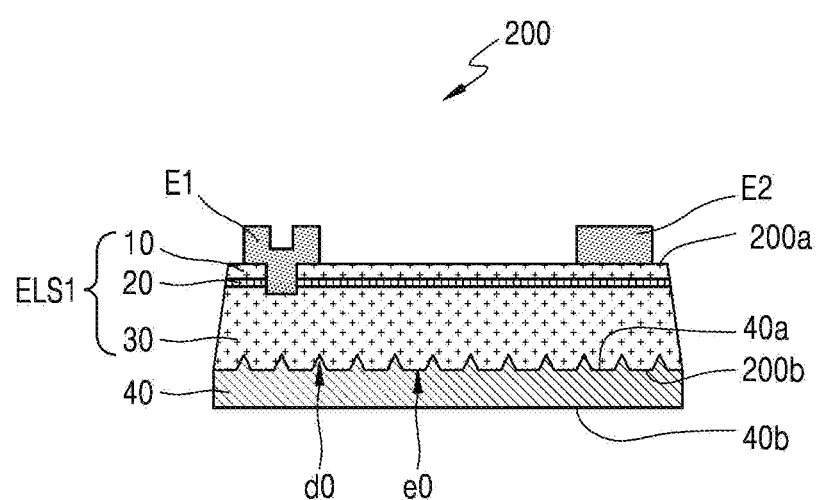
FIG. 4 is a diagram schematically illustrating a configuration of a micro light-emitting element according to an example embodiment.
Figure 5:
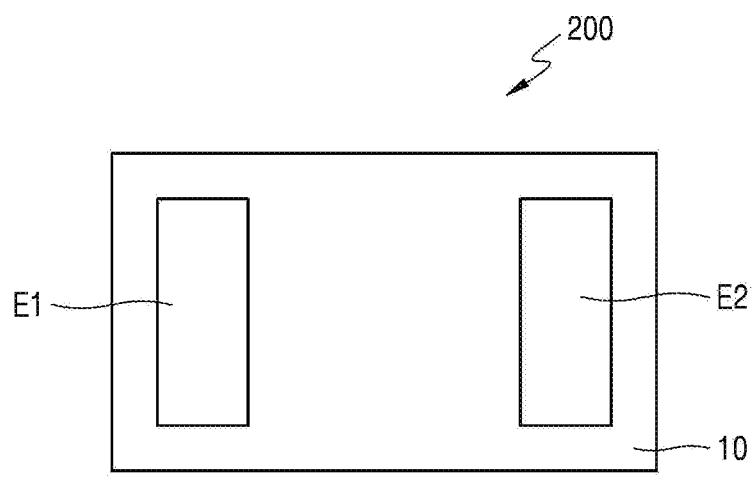
FIG. 5 is a plan view of the micro light-emitting element of FIG. 4.

FIG. 4 is a diagram schematically illustrating a configuration of a micro light-emitting element 200 according to an example embodiment. FIG. 5 is a plan view of the micro light-emitting element 200 of FIG. 4.

The configuration of the micro light-emitting element 200 of FIG. 4 may be applied to the plurality of micro light-emitting elements MC1 to MC12 of FIG. 1.

Referring to FIG. 4, the micro light-emitting element 200 may include a micro light-emitting structure ELS1 including a first surface 200a, on which the electrodes E1 and E2 are provided, a second surface 200b opposite to the first surface 200a and on which an uneven pattern is formed, a transparent coating layer 40 including a third surface 40a covering the second surface 200b and a fourth surface 40b facing the third surface 40a and having a second surface roughness that is less than a first surface roughness of the second surface 200b.

The micro light-emitting structure ELS1 may include a structure in which a first conductivity type semiconductor layer 30, an active layer 20, and a second conductivity type semiconductor layer 10 are sequentially stacked. The active layer 20 may be formed on the first conductivity-type semiconductor layer 30, and the second conductivity-type semiconductor layer 10 may be formed on the active layer 20. The first surface 200a of the micro light-emitting element 200 may be an upper surface of the second conductivity type semiconductor layer 10, and the second surface 200b of the micro light-emitting element 200 may be a lower surface of the first conductivity type semiconductor layer 30.

In this case, the first electrode E1 and the second electrode E2 spaced apart from each other may be provided on the upper surface of the second conductivity type semiconductor layer 10. Referring to FIG. 5, the first electrode E1 and the second electrode E2 may face each other and be respectively provided in edge regions of the upper surface of the second conductivity type semiconductor layer 10. However, the example embodiment is not limited thereto, and any one of the first electrode E1 and the second electrode E2 may be provided in a central region of the upper surface of the second conductivity type semiconductor layer 10.

For example, the first electrode E1 may be formed to penetrate the second conductivity type semiconductor layer 10 and the active layer 20 and extend to a partial region of the first conductivity type semiconductor layer 30. Accordingly, the first electrode E1 may be electrically connected to the first conductivity type semiconductor layer 30. According to an example embodiment, an insulating layer may further be formed between the first electrode E1 and the second conductivity type semiconductor layer 10 and between the first electrode E1 and the active layer 20. The second electrode E2 may be provided on the second conductivity type semiconductor layer 10 to be spaced apart from the first electrode E1.

Also, referring to FIG. 4, an uneven pattern may be formed on the lower surface, that is, the second surface 200b of the first conductivity type semiconductor layer 30. For example, an uneven pattern, in which a plurality of concave portions do and a plurality of convex portions e0 are alternately and periodically arranged, may be formed on the lower surface of the first conductivity type semiconductor layer 30. The plurality of concave portions do may include a predetermined concave shape, and the plurality of convex portions e0 may include a predetermined convex shape. Similarly, an uneven pattern that matches with the uneven pattern of the second surface 200b may also be formed on the third surface 40a of the transparent coating layer 40 covering the second surface 200b.

The lower surface of the first conductivity type semiconductor layer 30 having the uneven pattern, that is, the second surface 200b of the micro light-emitting structure ELS1, may have a first surface roughness. The first surface roughness of the second surface 200b may be several tens of nm RMS to several tens of μm RMS. However, the example embodiment is not limited thereto, and the first surface roughness may be several hundred μm RMS or more. In this way, when an uneven pattern is formed on the second surface 200b of the first conductivity type semiconductor layer 30, total reflection of light emitted from the active layer 20 on the second surface 200b less occurs, and thus, light extraction efficiency of the micro light-emitting element 200 may increase.

Each of the first conductivity type semiconductor layer 30 and the second conductivity type semiconductor layer 10 may include a semiconductor compound. For example, the first conductivity type semiconductor layer 30 and the second conductivity type semiconductor layer 10 may include at least one of a Group III/V compound semiconductor and a Group II/IV semiconductor compound, respectively. In addition, the first conductivity type semiconductor layer 30 may be doped with a first conductivity type dopant, and the second conductivity type semiconductor layer 10 may be doped with a second conductivity type dopant. When the first conductivity type semiconductor layer 30 is an n-type semiconductor layer, the first conductivity type dopant may include Si, Ge, Sn, Se, and Te as an n-type dopant, but is not limited thereto. In addition, when the second conductivity type semiconductor layer 10 is a p-type semiconductor layer, the second conductivity type dopant may include Mg, Zn, Ca, Sr, Ba, etc., as a p-type dopant, but is not limited thereto. On the other hand, the first conductivity type semiconductor layer 30 may be a p-type semiconductor layer, and the second conductivity type semiconductor layer 10 may be an n-type semiconductor layer.

In addition, each of the first conductivity type semiconductor layer 30 and the second conductivity type semiconductor layer 10 may include a semiconductor material having a composition formula of $Al_xIn_yGa_{(1-xy)}N$ ($0 \leq x \leq 1$, $0 \leq y \leq 1$, and $0 \leq x+y \leq 1$). Furthermore, each of the first conductivity type semiconductor layer 30 and the second conductivity type semiconductor layer 10 may include one or more of GaN, InN, AlN, InGaN, AlGaN, InAlGaN, AllnN, AlGaAs, InGaAs, AllnGaAs, GaP, AlGaP, InGaP, AllnGaP, and InP.

The active layer 20 is a layer that emits light having energy determined by an inherent energy band of a material constituting the active layer 20 when electrons injected through the first conductivity type semiconductor layer 30, which is an n-type semiconductor layer, and holes injected through the second conductivity type semiconductor layer 10 meet each other.

In addition, the active layer 20 may include at least one of a double hetero junction structure, a single quantum well structure, a multi quantum well (MQW) structure, a quantum wire structure, and a quantum dot structure.

A well layer/barrier layer of the active layer 20 may be formed in one or more pair structures including, for example, at least one of InGaN/GaN, InGaN/InGaN, GaN/AlGaN, InAlGaN/GaN, InAlGaN/InAlGaN, GaAs (InGaAs)/AlGaAs, and GaP (InGaP)/AlGaP, but is not limited thereto. Here, the well layer may include a material having a bandgap less than that of the barrier layer.

The micro light-emitting structure ELS1 may be formed by using, for example, a metal organic chemical vapor deposition (MOCVD) method, a chemical vapor deposition (CVD) method, a plasma-enhanced chemical vapor deposition (PECVD) method, a molecular beam epitaxy method, a hydride vapor phase epitaxy (HVPE) method, etc., but is not limited thereto.

According to an example embodiment, because the second surface 200b of the micro light-emitting structure ELS1 includes an uneven pattern having a first surface roughness that may be several tens of nm RMS to several tens of μm RMS, when the second surface 200b is in direct contact with the substrate 100, adhesive force between the micro light-emitting structure ELS1 and the substrate 100 is weak, and thus, a transfer yield of the micro light-emitting structure ELS1 to the substrate 100 may not be high.

On the contrary, because the fourth surface 40b of the transparent coating layer 40 has a second surface roughness that is less than the first surface roughness of the second surface 200b, when the fourth surface 40b of the transparent coating layer 40 is in contact with the substrate 100, because the adhesive force between the micro light-emitting element 200 and the substrate 100 is relatively strong, the transfer yield of the micro light-emitting element 200 to the substrate 100 may be relatively high.

For example, the second surface roughness of the fourth surface 40b of the transparent coating layer 40 may be 5 nm RMS or less. Preferably, the second surface roughness of the fourth surface 40b of the transparent coating layer 40 may be 2 nm RMS or less. Because a relatively strong van der Waals force acts between the substrate 100 and the fourth surface 40b of the transparent coating layer 40 having a second surface roughness that is less than the first surface roughness of the second surface 200b of the micro light-emitting structure ELS1 and the substrate 100, a relatively strong adhesive force is formed between the micro light-emitting element 200 and the substrate 100, and accordingly, the transfer yield of the micro light-emitting element 200 to the substrate 100 may be relatively high.

As such, the extraction efficiency of light emitted from the active layer 20 may be increased by the second surface 200b having a relatively large first surface roughness of the micro light-emitting structure ELS1 included in the micro light-emitting element 200. At the same time, because the adhesive force between the micro light-emitting element 200 and the substrate 100 is increased by the fourth surface 40b of the transparent coating layer 40 having a relatively small second surface roughness, the transfer yield of the micro light-emitting element 200 to the substrate 100 may be increased.

In addition, as the light emitted from the active layer 20 passes through the second surface 200b of the first conductivity type semiconductor layer 30, the traveling direction of light may greatly vary. Accordingly, because an incident angle of light to the fourth surface 40b of the transparent coating layer 40 greatly varies, the probability that total reflection occurs on the fourth surface 40b of the transparent coating layer 40 may be greatly reduced. As a result, although the fourth surface 40b is relatively flat compared to the second surface 200b, the light extraction efficiency at the fourth surface 40b may still be maintained high similar to the light extraction efficiency at the second surface 200b.

The transparent coating layer 40 may have a refractive index that is less than that of the first conductivity type semiconductor layer 30. For example, the refractive index of the transparent coating layer 40 may have a value between 1 and 2, but is not limited thereto. In this case, a critical angle between the transparent coating layer 40 and air may be greater than a critical angle causing total reflection between the first conductivity type semiconductor layer 30 and air. As such, because the critical angle between the transparent coating layer 40 and air is relatively large, the probability that total reflection of light occurs on the fourth surface 40b of the transparent coating layer 40 may be significantly reduced.

Light emitted from the active layer 20 and transmitted through the second surface 200b of the micro light-emitting structure ELS1 may pass through the transparent coating layer 40 and may be emitted to the outside of the micro light-emitting element 200. The light transmittance of the transparent coating layer 40 may be 80% or more.

For example, the transparent coating layer 40 may include any one of polyimide (PI), spin-on-glass (SOG), photoresist, silicon oxide, and silicon nitride. Here, the spin-on glass may include hydrogen silsesquioxane (HSQ).

However, the example embodiment is not limited thereto, and other than the various materials listed above, the transparent coating layer 40 may include various materials having light transmittance.

Figure 6:
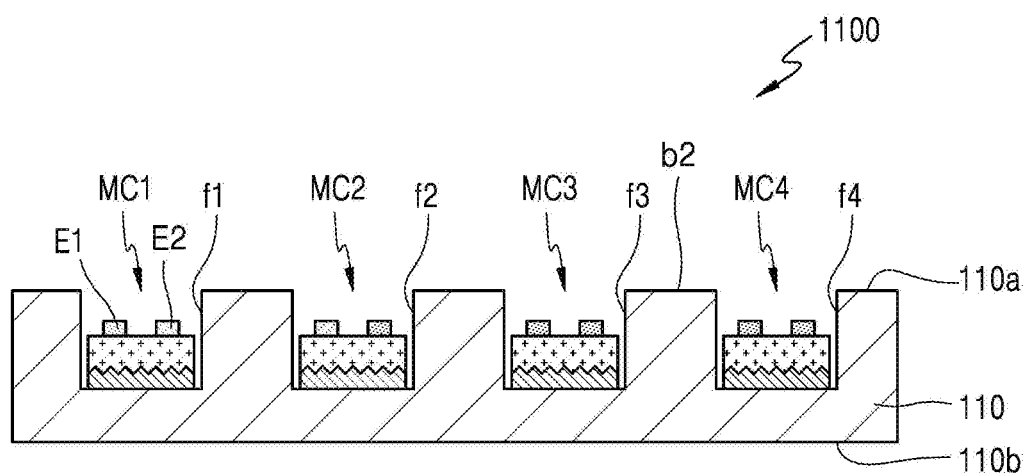
FIG. 6 is a lateral cross-sectional view schematically illustrating a configuration of a micro light-emitting element array according to another example embodiment.

FIG. 6 is a lateral cross-sectional view schematically illustrating a configuration of a micro light-emitting element array 1100 according to another example embodiment.

The micro light-emitting element array 1100 of FIG. 6 may be substantially the same as the micro light-emitting element array 1000 of FIG. 2 except that the micro light-emitting element array 1100 includes a substrate 110 including a plurality of grooves f1, f2, f3, and f4, and a plurality of micro light-emitting elements MC1, MC2, MC3, and MC4 are respectively formed in the plurality of grooves f1, f2, f3, and f4. Hereinafter, structural differences between the substrate 110 of FIG. 6 and the substrate 100 of FIG. 2 will be described.

Referring to FIG. 6, the micro light-emitting element array 1100 may include a substrate 110 and a plurality of micro light-emitting elements MC1, MC2, MC3, and MC4 provided in the substrate 110.

The substrate 110 may be a transfer substrate in the form of a mold substrate. For example, a plurality of grooves f1, f2, f3, and f4 may be formed in an upper surface of the substrate 110. At least one of the plurality of micro light-emitting elements MC1, MC2, MC3, and MC4 may be provided in each of the plurality of grooves f1, f2, f3, and f4. For example, the first micro light-emitting element MC1 may be provided in the first groove f1, the second micro light-emitting element MC2 may be provided in the second groove f2, the third micro light-emitting element MC3 may be provided in the third groove f3, and the fourth micro light-emitting element MC4 may be provided in the fourth groove f4. However, the example embodiment is not limited thereto, and two or more micro light-emitting elements may be provided in one groove.

A region where the plurality of grooves f1, f2, f3, and f4, in which the plurality of micro light-emitting elements MC1, MC2, MC3, and MC4 are provided, may be referred to as a first region. In addition, a region of the upper surface 110a of the substrate 110 other than the plurality of grooves f1, f2, f3, and f4 where the plurality of micro light-emitting elements MC1, MC2, MC3, and MC4 are provided, may be referred to as a second region b2. The second region b2 may surround the plurality of grooves f1, f2, f3, and f4, which are the first region.

Each of the plurality of micro light-emitting elements MC1, MC2, MC3, and MC4 may have the same structure as the micro light-emitting element 200 of FIG. 4. Each of the plurality of micro light-emitting elements MC1, MC2, MC3, and MC4 may be arranged so that the first surface 200a of the micro light-emitting element 200 (refer to FIG. 4) faces upper openings of the plurality of grooves f1, f2, f3, and f4. In this case, the fourth surface 40b of each of the plurality of micro light-emitting elements MC1, MC2, MC3, and MC4 may contact a bottom of the plurality of grooves f1, f2, f3, and f4.

A relatively strong van der Waals force acts between the fourth surface 40b of the transparent coating layer 40 having a relatively low second surface roughness of each of the plurality of micro light-emitting elements MC1, MC2, MC3, and MC4 and the bottoms of the plurality of grooves f1, f2, f3, and f4. Accordingly, a relatively strong adhesive force may be formed between each of the plurality of micro light-emitting elements MC1, MC2, MC3, and MC4 and the substrate 110, and thus, the transfer yield of the plurality of micro light-emitting elements MC1 to MC4 to the substrate 110 may be relatively high.

Figure 7:
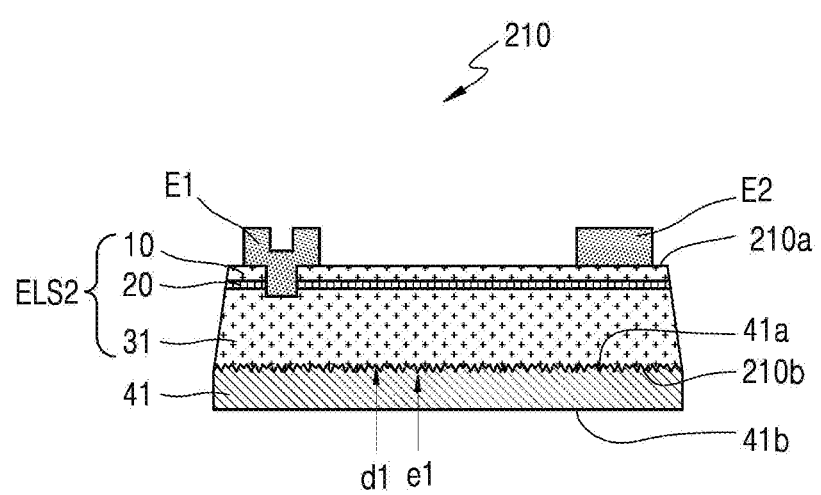
FIG. 7 is a diagram schematically illustrating a configuration of a micro light-emitting element according to another example embodiment.
Figure 8:
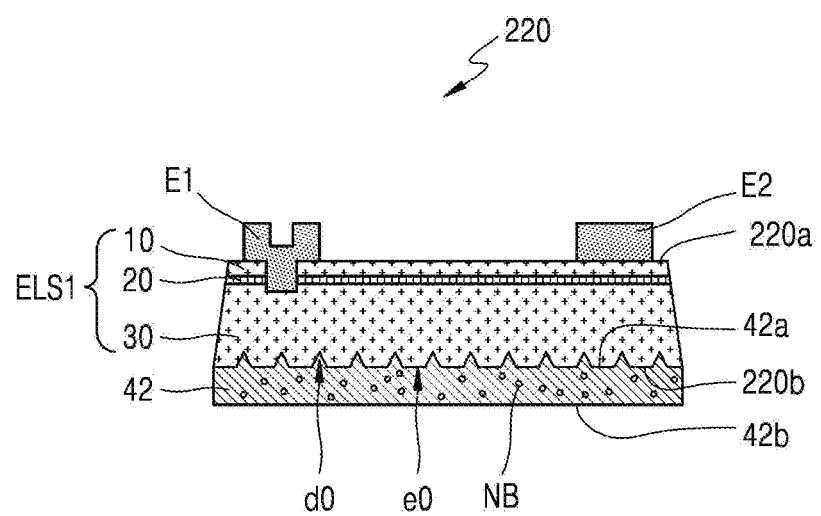
FIG. 8 is a diagram schematically illustrating a configuration of a micro light-emitting element according to another example embodiment.
Figure 9:
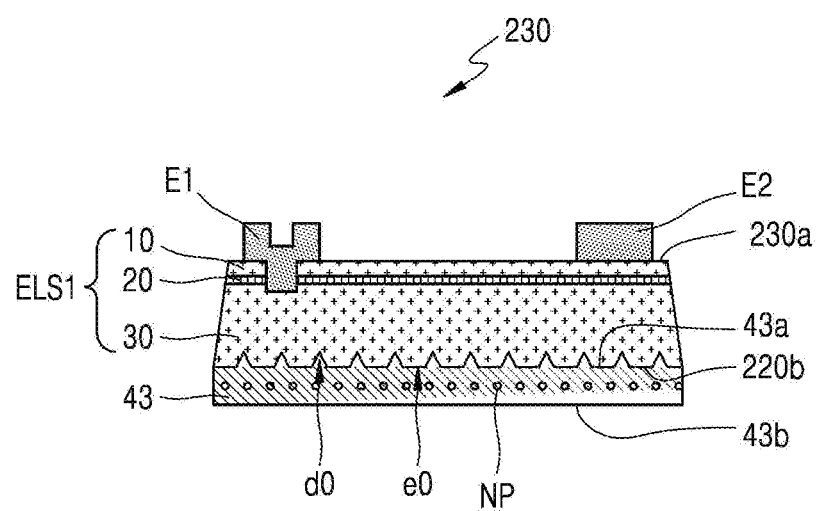
FIG. 9 is a diagram schematically illustrating a configuration of a micro light-emitting element according to another example embodiment.
Figure 10:
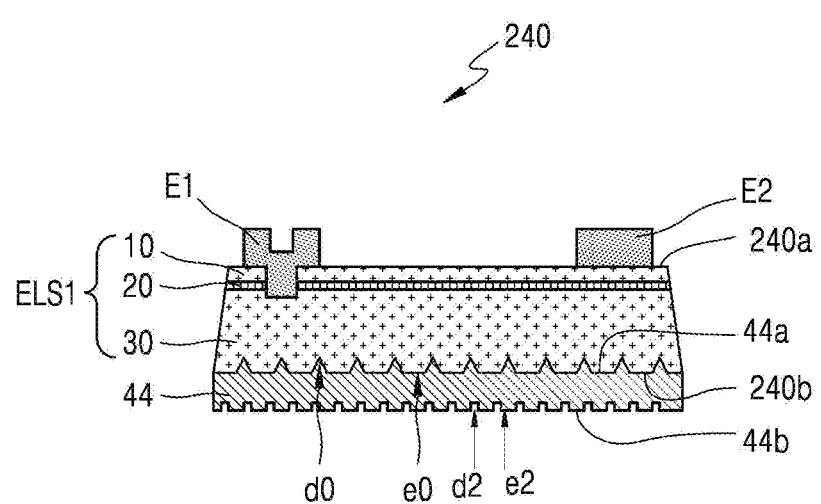
FIG. 10 is a diagram schematically illustrating a configuration of a micro light-emitting element according to another example embodiment.
Figure 11:
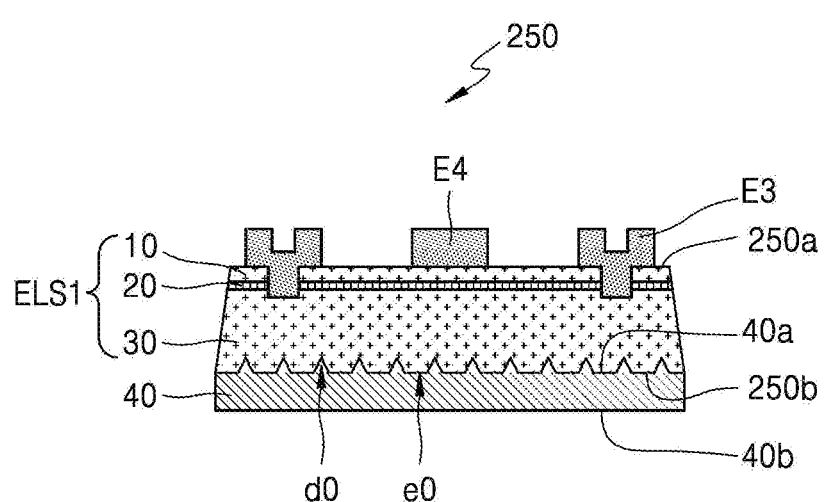
FIG. 11 is a diagram schematically illustrating a configuration of a micro light-emitting element according to another example embodiment.
Figure 12:
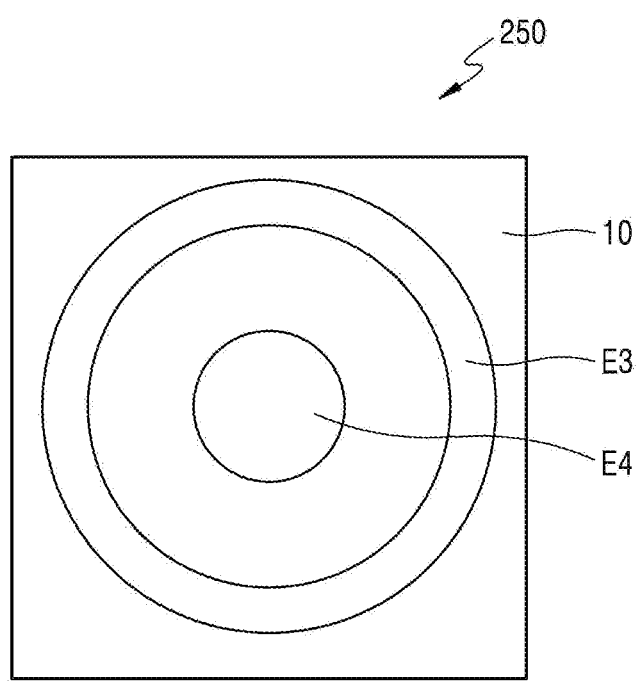
FIG. 12 is a plan view of the micro light-emitting element of FIG. 11.
Figure 13:
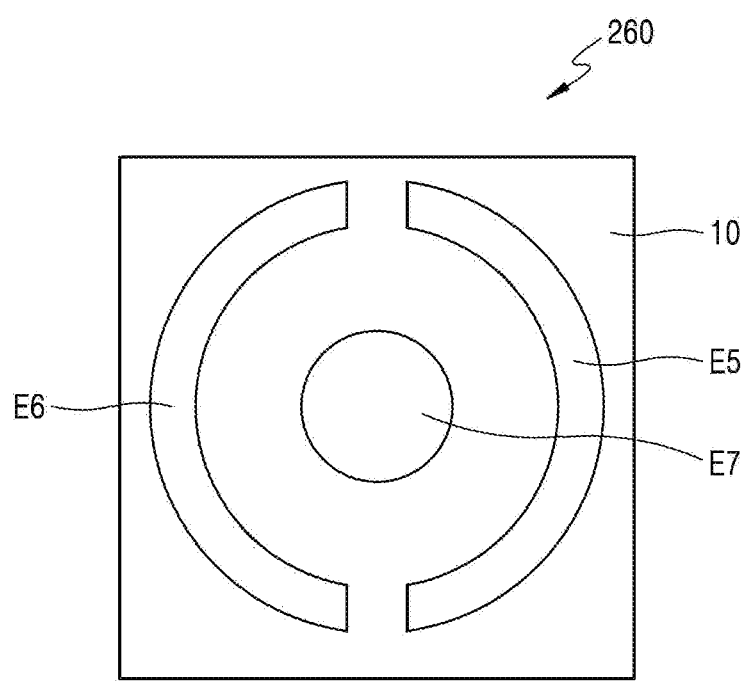
FIG. 13 is a plan view schematically illustrating a configuration of a micro light-emitting element according to another example embodiment.

FIG. 7 is a diagram schematically illustrating a configuration of a micro light-emitting element 210 according to another example embodiment. FIG. 8 is a diagram schematically illustrating a configuration of a micro light-emitting element 220 according to another example embodiment. FIG. 9 is a diagram schematically illustrating a configuration of a micro light-emitting element 230 according to another example embodiment. FIG. 10 is a diagram schematically illustrating a configuration of a micro light-emitting element 240 according to another example embodiment. FIG. 11 is a diagram schematically illustrating a configuration of a micro light-emitting element 250 according to another example embodiment. FIG. 12 is a plan view of the micro light-emitting element 250 of FIG. 11. FIG. 13 is a plan view schematically illustrating a configuration of a micro light-emitting element 260 according to another example embodiment.

The micro light-emitting elements 210, 220, 230, 240, 250, and 260 according to various example embodiments described below with reference to FIGS. 7 to 13 may be provided on the substrate 100 of FIG. 1 or the substrate 110 of FIG. 6.

The micro light-emitting element 210 of FIG. 7 may be substantially the same as the micro light-emitting element 200 of FIG. 4 except that the structures of a first conductivity type semiconductor layer 31 and a transparent coating layer 41 are different from the structures of the first conductivity type semiconductor layer 30 and the transparent coating layer 40 of FIG. 4. In the description of the structure illustrated in FIG. 7, descriptions of elements already given with reference to FIG. 4 will be omitted.

Referring to FIG. 7, the micro light-emitting element 210 may include a micro light-emitting structure ELS2 including a first surface 210a on which electrodes E1 and E2 are provided and a second surface 210b facing the first surface 210a and on which an uneven pattern is formed, and a transparent coating layer 41 including a third surface 41a covering the second surface 210b and a fourth surface 41b facing the third surface 41a and having a second surface roughness that is less than a first surface roughness of the second surface 210b. According to an example embodiment, a second surface 210b facing the first surface 210a may refer to a second surface 210b, which is on an opposite side of the first surface 210a.

The micro light-emitting structure ELS2 may include a structure in which a first conductivity type semiconductor layer 31, an active layer 20, and a second conductivity type semiconductor layer 10 are sequentially stacked. The active layer 20 may be formed on the first conductivity type semiconductor layer 31, and the second conductivity type semiconductor layer 10 may be formed on the active layer 20. The first surface 210a of the micro light-emitting element 210 may be an upper surface of the second conductivity type semiconductor layer 10, and the second surface 210b of the micro light-emitting element 200 may be a lower surface of the first conductivity type semiconductor layer 31.

Also, an uneven pattern may be formed on the lower surface of the first conductivity-type semiconductor layer 31. For example, a random uneven pattern, in which a plurality of concave portions d1 and a plurality of convex portions e1 are randomly and alternately arranged, may be formed on the lower surface of the first conductivity type semiconductor layer 31. In this case, the plurality of concave portions d1 may include a random concave shape, and the plurality of convex portions e1 may include a random convex shape. The random uneven pattern formed on the lower surface of the first conductivity type semiconductor layer 31 may be formed by etching the lower surface of the first conductivity type semiconductor layer 31.

The micro light-emitting element 220 of FIG. 8 may be substantially the same as the micro light-emitting element 200 of FIG. 4 except that the structure of a transparent coating layer 42 is different from the structure of the transparent coating layer 40 of FIG. 4. In the description of the structure illustrated in FIG. 8, descriptions of elements already given with reference to FIG. 4 will be omitted.

Referring to FIG. 8, the micro light-emitting element 220 may include a micro light-emitting structure ELS1 including a first surface 220a on which electrodes E1 and E2 are provided and a second surface 220b facing the first surface 220a and on which an uneven pattern is formed, and a transparent coating layer 42 including a third surface 42a covering the second surface 220b and a fourth surface 42b having a second surface roughness that is less than a first surface roughness of the second surface 220b.

According to an example embodiment, Aa plurality of nano-beads NB may be formed inside the transparent coating layer 42. The plurality of nano-beads NB may be randomly distributed in the transparent coating layer 42. The plurality of nano-beads NB may have a fine structure having a size of several nm. The plurality of nano-beads NB may scatter light emitted from the active layer 20, and accordingly, the light extraction efficiency of the micro light-emitting element 220 may be improved. The plurality of nano-beads NB may include, for example, silica. However, the example embodiment is not limited thereto, and the plurality of nano-beads NB may include various materials other than silica capable of scattering light.

The micro light-emitting element 230 of FIG. 9 may be substantially the same as the micro light-emitting element 200 of FIG. 4 except that the structure of a transparent coating layer 43 is different from the structure of the transparent coating layer 40 of FIG. 4. In the description of the structure illustrated in FIG. 9, descriptions of elements already given with reference to FIG. 4 will be omitted.

Referring to FIG. 9, the micro light-emitting element 230 may include a micro light-emitting structure ELS1 including a first surface 230*a* on which electrodes E1 and E2 are provided and a second surface 230*b* facing the first surface 230*a* and on which an uneven pattern is formed, and a transparent coating layer 43 including a third surface 43*a* covering the second surface 230*b* and a fourth surface 43*b* having a second surface roughness that is less than a first surface roughness of the second surface 230*b*.

According to an example embodiment, a plurality of nano-pores NP may be formed inside the transparent coating layer 43. The plurality of nano-pores NP may be distributed separate from each other at regular intervals inside the transparent coating layer 43. However, the example embodiment is not limited thereto, and the plurality of nano-pores NP may be randomly distributed inside the transparent coating layer 43. The plurality of nano-pores NP may be pores having a size of several nm. That is, the plurality of nano-pores NP may be pores of which the inside is empty. The plurality of nano-pores NP may scatter light emitted from the active layer 20, and accordingly, the light extraction efficiency of the micro light-emitting element 230 may be improved.

The micro light-emitting element 240 of FIG. 10 may be substantially the same as the micro light-emitting element 200 of FIG. 4 except that the structure of a transparent coating layer 44 is different from the structure of the transparent coating layer 40 of FIG. 4. In the description of the structure illustrated in FIG. 10, descriptions of elements already given with reference to FIG. 4 will be omitted.

Referring to FIG. 10, the micro light-emitting element 240 may include a micro light-emitting structure ELS1 including a first surface 240*a* on which electrodes E1 and E2 are provided and a second surface 240*b* facing the first surface 240*a* and on which an uneven pattern is formed, and a transparent coating layer 44 including a third surface 44*a* covering the second surface 240*b* and a fourth surface 44*b* having a second surface roughness that is less than a first surface roughness of the second surface 240*b*.

According to an example embodiment, a fine uneven pattern may be formed on the fourth surface 44*b* of the transparent coating layer 44. For example, an intaglio nano-pattern may be formed on the fourth surface 44*b* of the transparent coating layer 44. In this case, the uneven pattern may be formed on the fourth surface 44*b* while maintaining the second surface roughness of the fourth surface 44*b* to be less than the first surface roughness of the second surface 240*b*. The extraction efficiency of light emitted from the active layer 20 may be improved by the uneven pattern formed on the fourth surface 44*b* of the transparent coating layer 44. In this way, because the uneven pattern is formed on the second surface 240*b* and the fourth surface 44*b* spaced apart from each other, the extraction efficiency of light emitted from the active layer 20 may be doubled. For example, a fine uneven pattern, in which a plurality of concave portions d2 and a plurality of convex portions e2 are alternately and periodically arranged, may be formed on the fourth surface 44*b* of the transparent coating layer 44. The plurality of concave portions d2 may include a predetermined concave shape, and the plurality of convex portions e2 may include a predetermined convex shape.

The micro light-emitting element 250 of FIG. 11 is substantially the same as the micro light-emitting element 200 of FIG. 4 except that the structures of electrodes E3 and E4 are different from the structures of the electrodes E1 and E2 of FIG. 4. In the description of the structure illustrated in FIG. 11, descriptions of elements already given with reference to FIG. 1 will be omitted.

Referring to FIG. 11, the micro light-emitting element 250 may include a micro light-emitting structure ELS1 including a first surface 250*a* on which electrodes E3 and E4 are provided and a second surface 250*b* facing the first surface 250*a* and on which an uneven pattern is formed, and a transparent coating layer 40 including a third surface 40*a* covering the second surface 200*b* and a fourth surface 40*b* having a second surface roughness that is less than a first surface roughness of the second surface 200*b*.

The first electrode E3 and the second electrode E4 may be provided separate from each other on an upper surface of the second conductivity type semiconductor layer 10. The first electrode E3 may have a ring shape provided to correspond to an edge of the first surface 250*a*, and the second electrode E4 may be provided to be surrounded by the first electrode E3. For example, as shown in FIG. 12, the ring-shaped first electrode E3 provided at the edge of the first surface 250*a* may be provided to surround the circular shaped second electrode E4 provided at the center of the first surface 250*a*.

Meanwhile, referring to FIG. 13, the micro light-emitting element 260 according to another example embodiment may include first electrodes E5 and E6 and a second electrode E7 separated from each other on the second conductivity type semiconductor layer 10. The first electrodes E5 and E6 may include a first first (1-1) electrode E5 and a second first (1-2) electrode E6, each having a half annular shape and provided on the edge of an upper surface of the second conductivity type semiconductor layer 10. The first first (1-1) electrode E5 and the second first (1-2) electrode E6 may be provided to be separated from each other. The first first (1-1) electrode E5 and the second first (1-2) electrode E6 may be provided to surround the circular shaped second electrode E7 provided at the center of the upper surface of the second conductivity type semiconductor layer 10.

Figure 14:
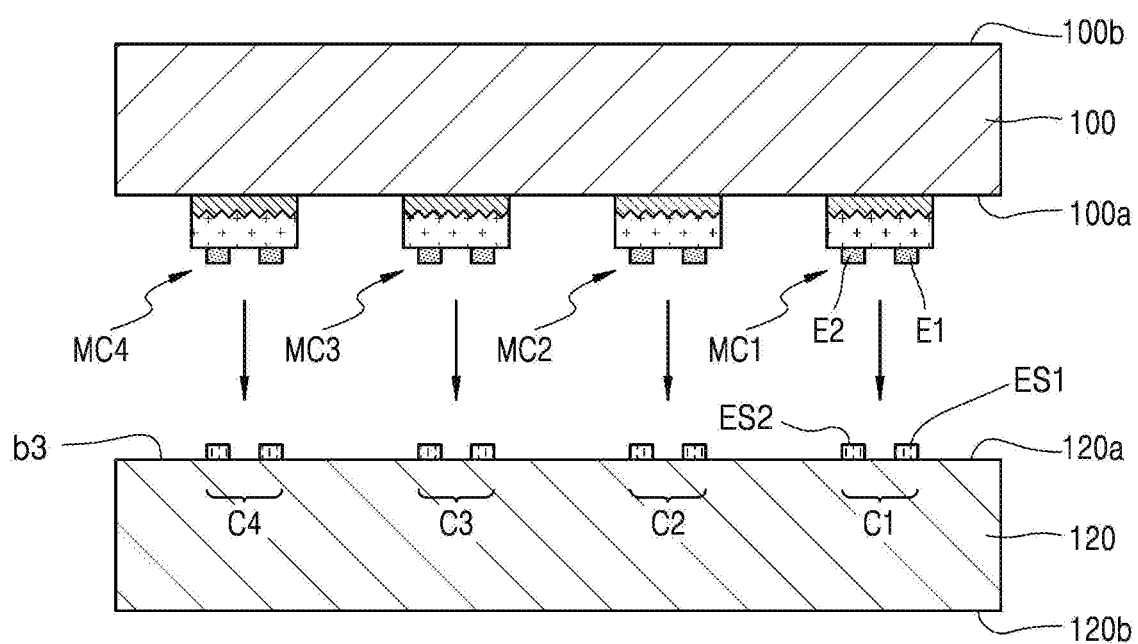
FIG. 14 is a diagram for describing a case in which a plurality of micro light-emitting elements are transferred to a driving circuit board according to an example embodiment.
Figure 15:
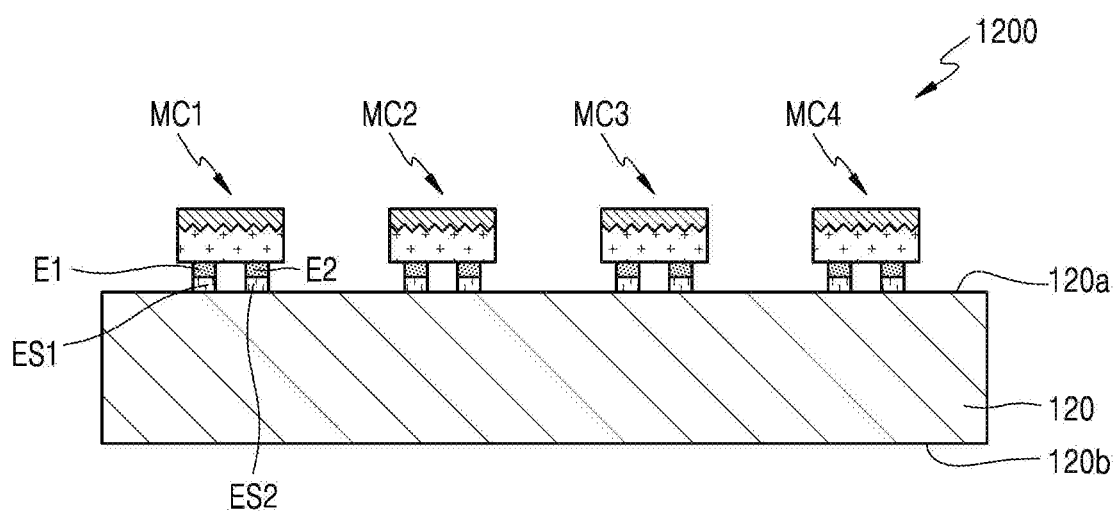
FIG. 15 is a lateral cross-sectional view schematically illustrating a configuration of a micro light-emitting element array according to another example embodiment.

FIG. 14 is a diagram for describing a case in which a plurality of micro light-emitting elements MC1, MC2, MC3, and MC4 are transferred to a driving circuit board 120 according to an example embodiment. FIG. 15 is a lateral cross-sectional view schematically illustrating a configuration of a micro light-emitting element array 1200 according to another example embodiment.

Referring to FIG. 14, the plurality of micro light-emitting elements MC1, MC2, MC3, and MC4 provided on the substrate 100 may be transferred to the driving circuit board 120. Because the structure of the substrate 100 and the plurality of micro light-emitting elements MC1, MC2, MC3, and MC4 has been described with reference to FIGS. 1 to 13, here, the description thereof will be omitted.

The driving circuit board 120 may include an upper surface 120*a* and a lower surface 120*b* facing the upper surface 120*a*. Here, a lower surface 120*b* facing the upper surface 120*a* may refer to the lower surface 120*b* being on an opposite side of the upper surface 120*a* of the driving circuit board 120. The upper surface 120*a* of the driving circuit board 120 may include a plurality of electrode structures ES1 and ES2 provided in each of the plurality of element regions C1, C2, C3, and C4 separated from each other. In FIG. 14, four element regions C1, C2, C3, and C4 are illustrated, but the example embodiment is not limited thereto, and an innumerable plurality of element regions C1, C2, C3, and C4 may be provided. The plurality of element regions C1, C2, C3, and C4 in which the plurality of electrode structures ES1 and ES2 are provided may be referred to as a first region.

In addition, a region of the upper surface 120a of the driving circuit board 120 other than the plurality of element regions C1, C2, C3 on which the plurality of electrode structures ES1 and ES2 are provided may be referred to as a second region b3. The second region b3 may surround the plurality of element regions C1, C2, C3, and C4, which are the first region.

The driving circuit board 120 is a substrate providing a signal necessary to operate the plurality of micro light-emitting elements MC1, MC2, MC3, and MC4, and may include a plurality of driving circuits according to an example embodiment. Each of the plurality of driving circuits may correspond to the plurality of element regions C1, C2, C3, and C4. For example, each of the plurality of driving circuits may include at least one transistor and at least one capacitor.

After arranging the plurality of micro light-emitting elements MC1, MC2, MC3, and MC4 provided on the substrate 100 to face the upper surface 120a of the driving circuit board 120, the plurality of micro light-emitting elements MC1, MC2, MC3, and MC4 may be bonded to each of the plurality of element regions C1, C2, C3, and C4. In this case, each of the plurality of micro light-emitting elements MC1, MC2, MC3, and MC4 may be electrically connected to the plurality of electrode structures ES1 and ES2 provided in each of the plurality of element regions C1, C2, C3, and C4. For example, the first electrode structure ES1 and the second electrode structure ES2 provided to be separated from each other on the first element region C1 respectively are electrically connected to the first electrode E1 and the second electrode E2 of the first micro light-emitting element MC1. In this case, the first electrode structure ES1 and the second electrode structure ES2 may be electrically connected to a driving circuit corresponding to the first element region C1.

On the other hand, when the first micro light-emitting element MC1 has the structure described with reference to FIGS. 11 to 13, the first electrode structure ES1 and the second electrode structure ES2 may be formed to have a structure corresponding to the first electrodes E3, E5, and E6 and the second electrodes E4 and E7 included in the first micro light-emitting element MC1.

In this way, as shown in FIG. 15, the micro light-emitting element array 1200 including the driving circuit board 120 may be formed by transferring the plurality of micro light-emitting elements MC1, MC2, MC3, and MC4 to the driving circuit board 120.

Figure 16:
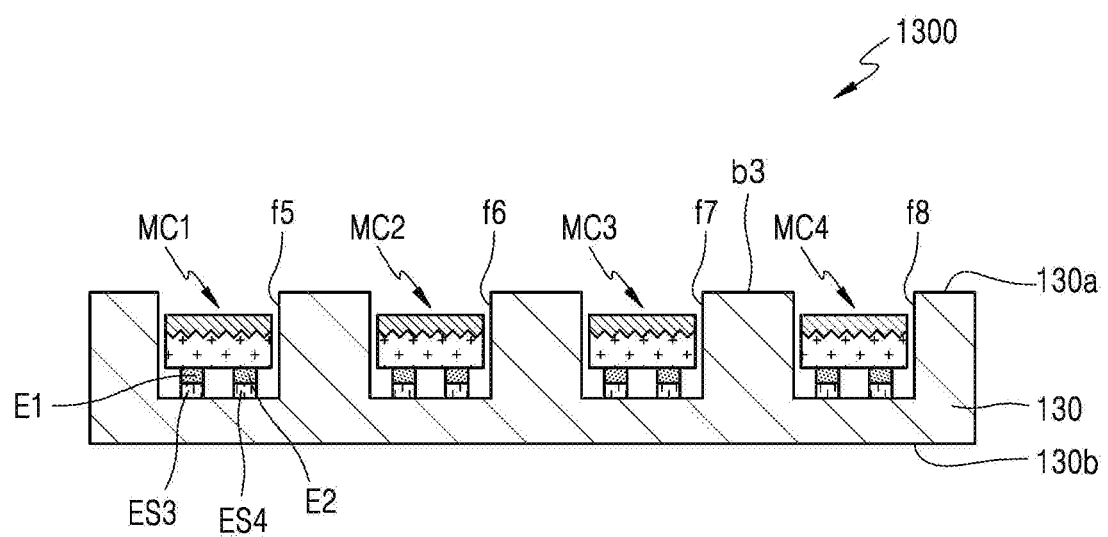
FIG. 16 is a lateral cross-sectional view schematically illustrating a configuration of a micro light-emitting element array according to another example embodiment.

FIG. 16 is a lateral cross-sectional view schematically illustrating a configuration of a micro light-emitting element array 1300 according to another example embodiment.

The micro light-emitting element array 1300 of FIG. 16 may be substantially the same as the micro light-emitting element array 1200 of FIG. 15 except that a driving circuit board 130 includes a plurality of grooves f5, f6, f7, and f8 and a plurality of light-emitting elements MC1, MC2, MC3, and MC4 are provided in the plurality of grooves f5, f6, f7, and f8. Hereinafter, structural differences between the driving circuit board 130 of FIG. 16 and the driving circuit board 120 of FIG. 15 will be described.

Referring to FIG. 16, the micro light-emitting element array 1300 may include the driving circuit board 130 and a plurality of micro light-emitting elements MC1 to MC4 provided in the driving circuit board 130.

The plurality of grooves f5, f6, f7, and f8 may be formed in an upper surface 130a of the driving circuit board 130. A plurality of electrode structures ES3 and ES4 may be provided in each of the plurality of grooves f5, f6, f7, and f8. For example, the first electrode structure ES3 and the second electrode structure ES4 may be formed on bottom surfaces of each of the first groove f5, the second groove f6, the third groove f7, and the fourth groove f8.

At least one of the plurality of micro light-emitting elements MC1, MC2, MC3, and MC4 may be provided in each of the plurality of grooves f5, f6, f7, and f8. For example, the first micro light-emitting element MC1 may be provided in the first groove f5, the second micro light-emitting element MC2 may be provided in the second groove f6, the third micro light-emitting element MC2 may be provided in the third groove f7, and the fourth micro light-emitting element MC4 may be provided in the fourth groove f8. However, the example embodiment is not limited thereto, and two or more micro light-emitting elements may be provided in one groove.

The plurality of grooves f5, f6, f7, and f8 in which the plurality of micro light-emitting elements MC1 to MC4 are provided may be referred to as a first region. Also, a region of the upper surface 130a of the substrate 130 other than the plurality of grooves f5, f6, f7, and f8 on which the plurality of micro light-emitting elements MC1 to MC4 are provided may be referred to as a second region b3.

The configuration of the plurality of micro light-emitting elements MC1, MC2, MC3, and MC4 may include the configuration described with reference to FIGS. 1 to 13. For example, each of the plurality of micro light-emitting elements MC1, MC2, MC3, and MC4 may include the same structure as the micro light-emitting element 200 of FIG. 4. Each of the plurality of micro light-emitting elements MC1, MC2, MC3, and MC4 may be arranged so that the electrodes (E1 and E2 in FIG. 4) provided on the first surface (200a in FIG. 4) are in contact with the plurality of electrode structures ES3 and ES4 provided in the plurality of grooves f5, f6, f7, and f8 and the fourth surface (40b of FIG. 4) faces upper openings of the plurality of grooves f5, f6, f7, and f8. In this case, the first electrode E1 may contact the first electrode structure ES3, and the second electrode E2 may contact the second electrode structure ES4.

Figure 17:
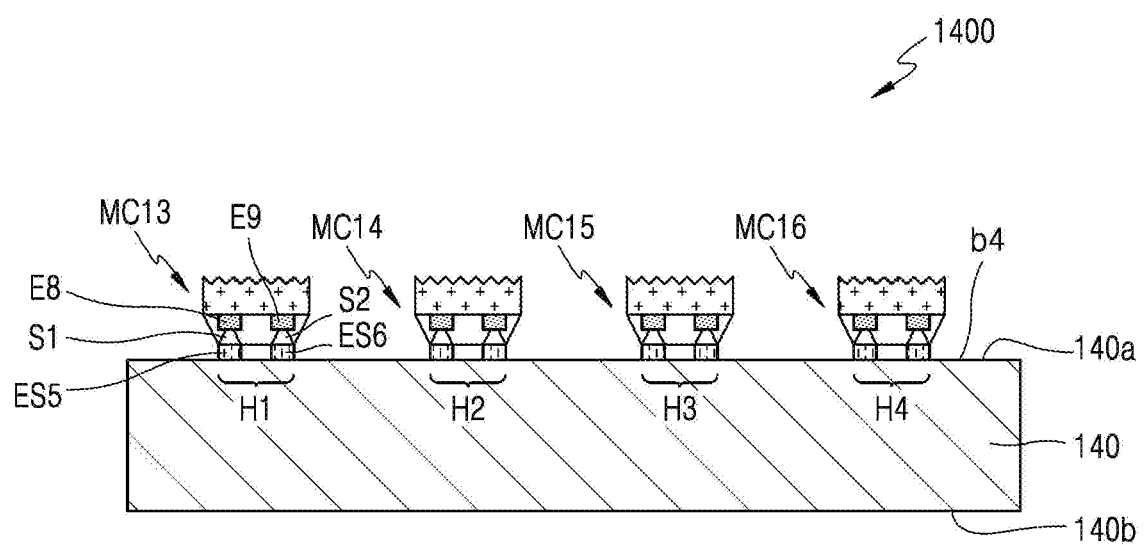
FIG. 17 is a lateral cross-sectional view schematically illustrating a configuration of a micro light-emitting element array according to another example embodiment.
Figure 18:
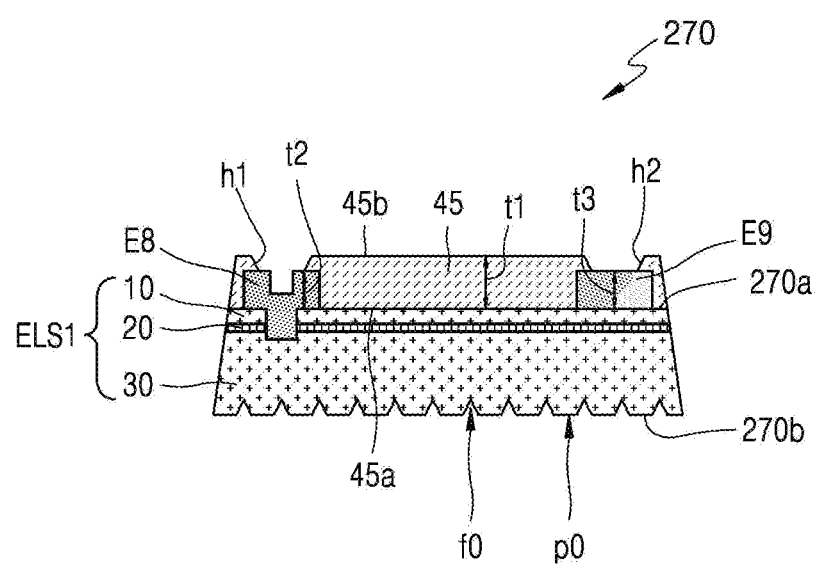
FIG. 18 is a diagram schematically illustrating a configuration of a micro light-emitting element according to another example embodiment.

FIG. 17 is a lateral cross-sectional view schematically illustrating a configuration of a micro light-emitting element array 1400 according to another example embodiment. FIG. 18 is a diagram schematically illustrating a configuration of a micro light-emitting element according to another example embodiment.

The micro light-emitting element array 1400 of FIG. 17 may be substantially the same as the micro light-emitting element array 1200 of FIG. 15 except that the structure of a plurality of micro light-emitting elements MC13, MC14, MC15, and MC16 is different from that of the plurality of micro light-emitting elements MC1, MC2, MC3, and MC4 described with reference to FIGS. 1 to 13.

Referring to FIG. 17, the micro light-emitting element array 1400 may include a driving circuit board 140 and the plurality of micro light-emitting elements MC13 to MC16 provided on the driving circuit board 140.

The driving circuit board 140 may include an upper surface 140a and a lower surface 140b that face each other. A plurality of electrode structures ES5 and ES6 provided in each of a plurality of element regions H1, H2, H3, and H4 separated from each other may be provided on the upper surface 140a of the driving circuit board 140. Although four element regions H1, H2, H3, and H4 are illustrated in FIG. 17, the example embodiment is not limited thereto, and an innumerable plurality of element regions H1, H2, H3, and H4 may be provided. For example, each of the plurality of element regions H1, H2, H3, and H4 may be a hydrophilic region.

The plurality of element regions H1, H2, H3, and H4 in which the plurality of micro light-emitting elements MC13, MC14, MC15, and MC16 are provided may be referred to as a first region. In addition, a region of the upper surface 140a of the driving circuit board 140 on which the plurality of micro light-emitting elements MC13, MC14, MC15, and MC16 other than the plurality of element regions H1, H2, H3, and H4 are not provided may be referred to as a second region b4. The second region b4 may be a hydrophobic region surrounding the plurality of element regions H1, H2, H3, and H4 that is the first region.

Each of the plurality of micro light-emitting elements MC13, MC14, MC15, and MC16 may be electrically connected to the plurality of electrode structures ES5 and ES6 provided in each of the plurality of element regions H1, H2, H3, and H4. For example, the first electrode structure ES5 and the second electrode structure ES6 provided to be separated from each other on the first element region H1 may be electrically connected to the first electrode E8 and the second electrode E9 of the first micro light-emitting element MC13, respectively. In this case, the first electrode structure ES5 and the second electrode structure ES6 may be electrically connected to a driving circuit corresponding to the first element region H1.

Each of the plurality of micro light-emitting elements MC13, MC14, MC15 and MC16 of FIG. 17 may have a configuration of a micro light-emitting element 270 shown in FIG. 18. Referring to FIG. 18, the micro light-emitting element 270 may include a micro light-emitting structure ELS1 including a first surface 270a on which the electrodes E8 and E9 are provided and a second surface 270b facing the first surface 270a and on which an uneven pattern is formed, and a transparent coating layer 45 including a third surface 45a covering a first surface 270a and a fourth surface 45b facing the third surface 45a and having a second surface roughness that is less than a first surface roughness of the second surface 270b.

The micro light-emitting element 270 may be substantially the same as the micro light-emitting element 200 of FIG. 4 except that the transparent coating layer 45 covers the first surface 270a of the light-emitting structure ELS1. Hereinafter, structural differences between the transparent coating layer 45 of FIG. 18 and the transparent coating layer 40 of FIG. 4 will be described.

The transparent coating layer 45 may be provided to cover the first surface 270a of the light-emitting structure ELS1. The transparent coating layer 45 may include holes h1 and h2 exposing at least a portion of the electrodes E8 and E9 provided on the first surface 270a. For example, a first hole h1 and a second hole h2 exposing at least a portion of the electrodes E8 and E9 may be formed on the fourth surface 45b of the transparent coating layer 45. The first hole h1 may expose at least a portion of the first electrode E8, and the second hole h2 may expose at least a portion of the second electrode E9.

Referring to FIGS. 17 and 18, the first electrode E8 and the first electrode structure ES5 on the driving circuit board 140 may be electrically connected to each other through the first hole h1. Also, the second electrode E9 and the second electrode structure ES6 on the driving circuit board 140 may be electrically connected to each other through the second hole h2. For example, the first electrode E8 and the first electrode structure ES5 may be electrically connected to each other and the second electrode E9 and the second electrode structure ES6 may be electrically connected to each other, respectively. According to an example embodiment, the first electrode E8 and the first electrode structure ES5 may be electrically connected to each other and the second electrode E9 and the second electrode structure ES6 may be electrically connected to each other, respectively, by conductive materials S1 and S2 filled in the first and second holes h1 and h2.

According to an example embodiment, a first thickness t1 of the transparent coating layer 45 may be greater than a second thickness t2 of the first electrode E8 or a third thickness t3 of the second electrode E9. In this case, the transparent coating layer 45 may be formed to cover a portion of upper surfaces of the electrodes E8 and E9. Accordingly, when the micro light-emitting element 270 is arranged on the driving circuit board 140, the fourth surface 45b of the transparent coating layer 45 may contact the plurality of electrode structures ES5 and ES6.

The second surface 270b of the micro light-emitting structure ELS1 may include an uneven pattern to have a first surface roughness that may be tens of nm RMS to tens of μm RMS. When the second surface 270b is in direct contact with the driving circuit board 140, an adhesive force between the micro light-emitting structure ELS1 and the driving circuit board 140 is weakly formed, thus, the transfer yield for the driving circuit board 140 of the micro light-emitting structure ELS1 may not be high.

On the contrary, because the fourth surface 45b of the transparent coating layer 45 has a second surface roughness that is less than the first surface roughness of the second surface 270b, when the fourth surface 45b is in direct contact with the driving circuit board 140, the adhesive force between the micro light-emitting element 270 and the driving circuit board 140 is relatively strong, thus, the transfer yield of the micro light-emitting element 270 to the driving circuit board 140 may be relatively high.

According to an example embodiment, the second surface roughness of the fourth surface 45b of the transparent coating layer 45 may be 5 nm RMS or less. Preferably, the second surface roughness of the transparent coating layer 45 may be 2 nm RMS or less. According to an example embodiment, because a relatively strong van der Waals force acts between the fourth surface 45b of the transparent coating layer 45 having the second surface roughness that is less than the first surface roughness of the second surface 270b of the micro light-emitting structure ELS1 and the driving circuit board 140, a relatively strong adhesive force is formed between the micro light-emitting element 270 and the driving circuit board 140, and accordingly, the transfer yield of the micro light-emitting element 270 to the driving circuit board 140 may be relatively high.

Figure 19:
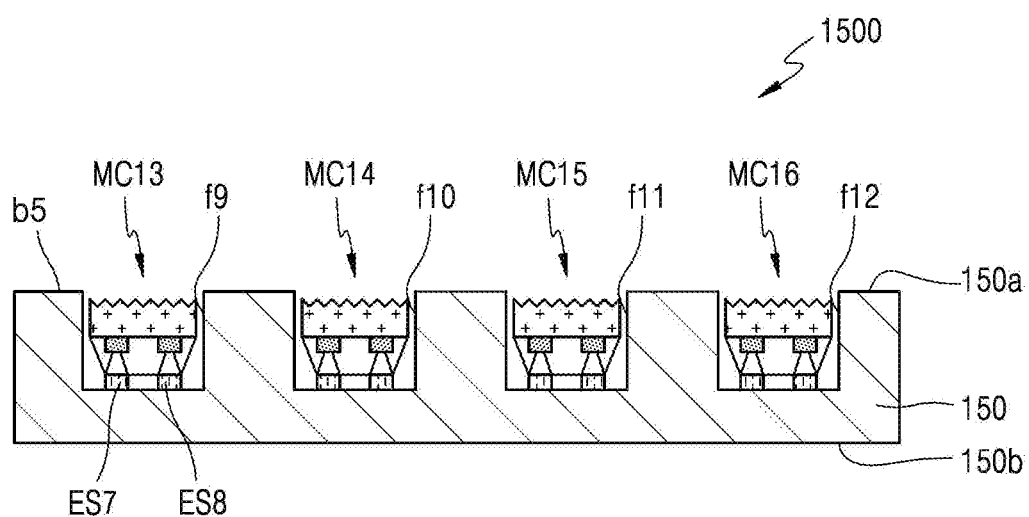
FIG. 19 is a lateral cross-sectional view schematically illustrating a configuration of a micro light-emitting element array according to another example embodiment.

FIG. 19 is a lateral cross-sectional view schematically illustrating a configuration of a micro light-emitting element array 1500 according to another example embodiment.

The micro light-emitting element array 1500 of FIG. 19 may be substantially the same as the micro light-emitting element array 1400 of FIG. 17 except that a driving circuit board 150 includes a plurality of grooves f9, f10, f11, and f12, and a plurality of micro light-emitting elements MC13, MC14, MC15, and MC16 are provided in the plurality of grooves f9, f10, f11, and f12. Hereinafter, structural differences between the driving circuit board 150 of FIG. 19 and the driving circuit board 140 of FIG. 17 will be described.

Referring to FIG. 19, the micro light-emitting element array 1500 may include the driving circuit board 150 and a plurality of micro light-emitting elements MC13, MC14, MC15, and MC16 provided in the driving circuit board 150.

A plurality of grooves f9, f10, f11, and f12 may be formed in an upper surface 150a of the driving circuit board 150. A plurality of electrode structures ES7 and ES8 may be provided in each of the plurality of grooves f9, f10, f11, and f12. For example, the first electrode structure ES7 and the second electrode structure ES8 may be provided on a bottom surface of each of the first groove f9, the second groove f10, the third groove f11, and the fourth groove f12.

According to an example embodiment, at least one of the plurality of micro light-emitting elements MC13, MC14, MC15, and MC16 may be provided in each of the plurality of grooves f9, f10, f11, and f12. For example, the first micro light-emitting element MC13 may be provided in the first groove f9, the second micro light-emitting element MC14 may be provided in the second groove f10, the third micro light-emitting element MC15 may be provided in the third groove f11, and the fourth micro light-emitting element MC16 may be provided in the fourth groove f12. However, the example embodiment is not limited thereto, and two or more micro light-emitting elements may be provided in one groove.

The plurality of grooves f9, f10, f11, and f12 in which the plurality of micro light-emitting elements MC13, MC14, MC15, and MC16 are provided may be referred to as a first region. In addition, a region of the upper surface 150a of the driving circuit board 150 other than the plurality of grooves f9, f10, f11, and f12 on which the plurality of micro light-emitting elements MC13, MC14, MC15, and MC16 are provided may be referred to as a second region b5. The second region b5 may surround the plurality of grooves f9, f10, f11, and f12 that are the first region.

Each of the plurality of micro light-emitting elements MC13, MC14, MC15, and MC16 may be arranged so that the second surface 270b faces upper openings of the plurality of grooves f9, f10, f11, and f12. In this case, the fourth surface 45b of each of the plurality of micro light-emitting elements MC13, MC14, MC15, and MC16 may contact a plurality of electrode structures ES8 and ES9 provided in the plurality of grooves f9, f10, f11, and f12.

The first electrode E8 and the first electrode structure ES7 on the driving circuit board 150 may be electrically connected to each other through the first hole h1. Also, the second electrode E9 and the second electrode structure ES8 on the driving circuit board 150 may be electrically connected to each other through the second hole h2. For example, the first electrode E8 and the first electrode structure ES7 may be electrically connected to each other by the conductive materials S1 and S2 filled in each of the first and second holes h1 and h2, and the second electrode E9 and the second electrode structure ES8 may be electrically connected to each other.

According to an example embodiment, because a relatively strong van der Waals force acts between the fourth surface 45b of the transparent coating layer 45 having a relatively low second surface roughness of each of the plurality of micro light-emitting elements MC13, MC14, MC15, and MC16 and a bottom of the plurality of grooves f9, f10, f11, f12, a relatively strong adhesive force may be formed between each of the plurality of micro light-emitting elements MC13, MC14, MC15, and MC16 and the driving circuit board 150, and accordingly, the transfer yield of the plurality of micro light-emitting elements MC13, MC14, MC15, and MC16 to the driving circuit board 150 may be relatively high.

Figure 20:
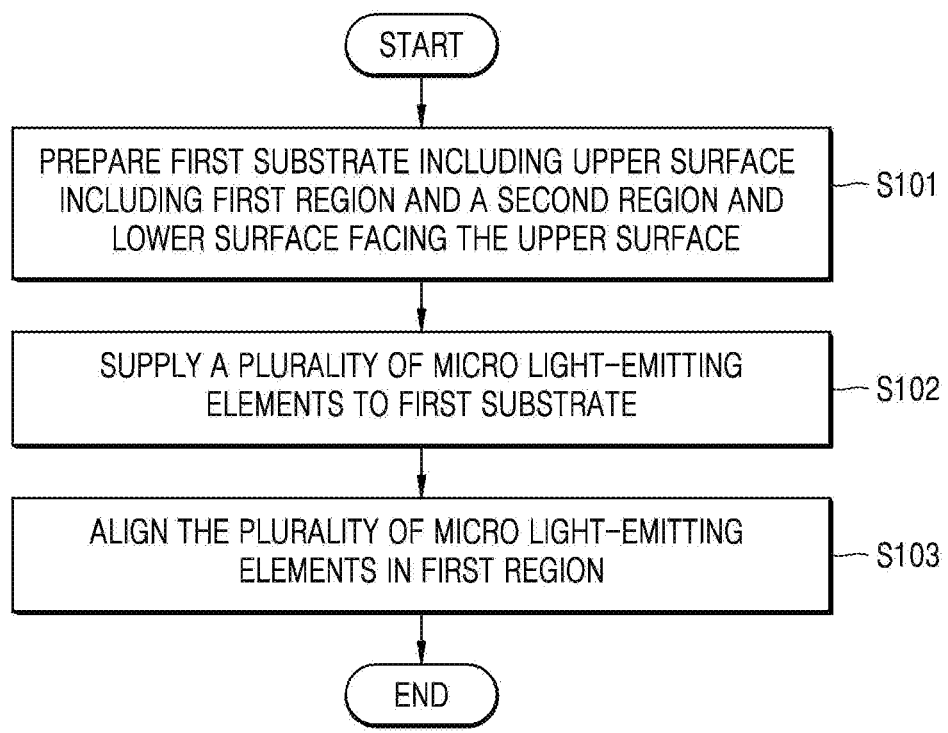
FIG. 20 is a flowchart of a method of manufacturing a micro light-emitting element array, according to an example embodiment.

FIG. 20 is a flowchart of a method of manufacturing a micro light-emitting element array according to an example embodiment.

Referring to FIG. 20, the method of manufacturing a micro light-emitting element array according to an example embodiment may include preparing a first substrate including an upper surface including a first region and a second region that are distinguished from each other, and a lower surface opposite to the upper surface (S101), supplying the plurality of micro light-emitting elements to the first substrate (S102), and aligning the plurality of micro light-emitting elements in the first region (S103).

In operation of preparing the first substrate (S101), a transfer substrate having upper and lower surfaces facing each other may be prepared. For example, the operation of preparing the first substrate (S101) may include preparing one of the substrate 100 including the hydrophilic regions a1 to a12 and a hydrophobic region b1 surrounding the hydrophilic regions a1 to a12 on the upper surface 100a of FIG. 1 and the substrate 110 including the plurality of grooves f1, f2, f3, and f4 of FIG. 6. In this case, the first substrate may be any one of the substrate 100 of FIG. 1 and the substrate 110 of FIG. 6.

However, the example embodiment is not limited thereto, and in the operation of preparing the first substrate (S101), a driving circuit board including an upper surface and a lower surface facing each other and having a plurality of electrode structures on the upper surface thereof may be prepared. For example, in the operation of preparing the first substrate (S101), any one of the driving circuit board 140 including the plurality of element regions H1, H2, H3, and H4 of FIG. 17 and the driving circuit board 150 including the plurality of grooves f9, f10, f11, and f12 may be prepared. In this case, the first substrate may be any one of the driving circuit board 140 of FIG. 17 and the driving circuit board 150 of FIG. 19.

In the operation of supplying a plurality of micro light-emitting elements (S102), a plurality of micro light-emitting elements 200, 210, 220, 230, 240, 250, 260, and 270 according to various embodiments described with reference to FIGS. 1 to 19 may be supplied to the first substrate. For example, when any one of the substrate 100 of FIG. 1 and the substrate 110 of FIG. 6 is prepared in the operation of preparing the first substrate (S101), the plurality of micro light-emitting elements 200, 210, 220, 230, 240, 250, and 260 described with reference to FIGS. 1 to 13 may be supplied to the first substrate. On the other hand, when any one of the driving circuit board 140 of FIG. 17 and the driving circuit board 150 of FIG. 19 is prepared in the operation of preparing the first substrate (S101), the plurality of micro light-emitting elements 270 described with reference to FIGS. 17 to 19 may be supplied to the first substrate.

In the operation of aligning a plurality of micro light-emitting elements in a first region (S103), the plurality of micro light-emitting elements may be arranged in the first region of the first substrate. For example, a plurality of micro light-emitting elements may be aligned in the first region of the first substrate by using various well-known wet and dry transfer techniques.

For example, in the operation of preparing the first substrate (S101), any one of the substrate 100 of FIG. 1 and the substrate 110 of FIG. 6 is prepared, and in the operation of supplying a plurality of micro light-emitting elements (S102), the plurality of micro light-emitting elements 200, 210, 220, 230, 240, 250, and 260 described with reference to FIGS. 1 to 13 may be supplied to the first substrate. In this case, in the operation of aligning the plurality of micro light-emitting elements in the first region (S103), the plurality of micro light-emitting elements 200, 210, 220, 230, 240, 250, and 260 may be aligned so that the fourth surfaces 40b, 41b, 42b, 43b, and 44b of each of the plurality of micro light-emitting elements 200, 210, 220, 230, 240, 250, and 260 may are in contact with the upper surfaces 100a and 110a of the substrates 100 and 110.

In addition, for example, in the operation of preparing the first substrate (S101), any one of the driving circuit board 140 of FIG. 17 and the driving circuit board 150 of FIG. 19 is prepared, and in the operation of supplying a plurality of micro light-emitting elements (S102), the plurality of micro light-emitting elements 270 described with reference to FIGS. 17 to 19 may be supplied to the first substrate. In this case, in an operation of aligning the plurality of micro light-emitting elements in the first region (S103), the plurality of micro light-emitting elements 270 may be aligned so that the fourth surface 45b of each of the plurality of micro light-emitting elements 270 are in contact with the upper surfaces 140a and 150a of the substrates 140 and 150.

A method of manufacturing a plurality of micro light-emitting elements according to an example embodiment will be described below with reference to FIGS. 21 to 36, and a method of aligning a plurality of micro light-emitting elements in a first region of a first substrate by using a wet alignment method according to an example embodiment will be described below with reference to FIGS. 37 to 40.

Figure 21:
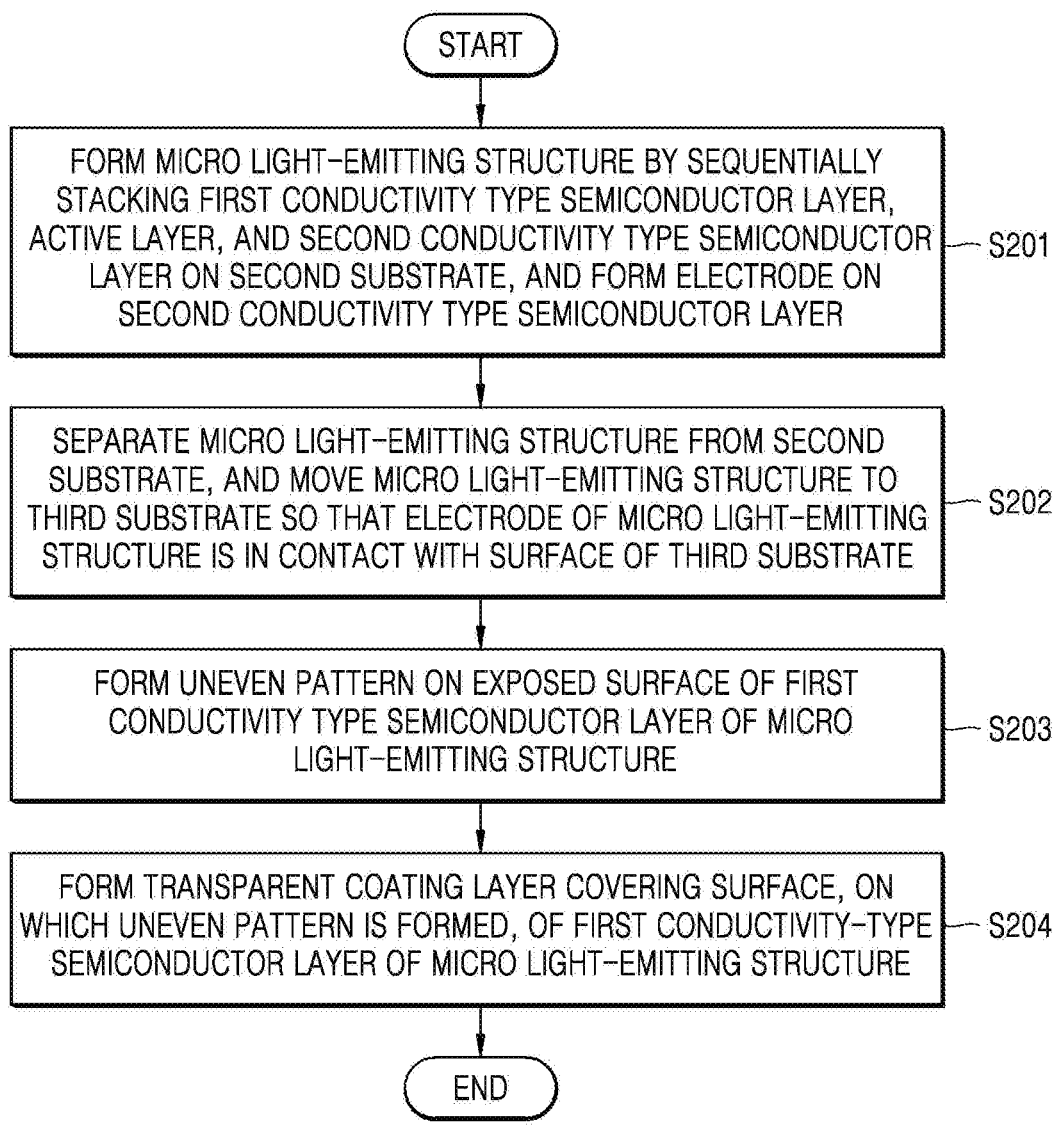
FIG. 21 is a flowchart of a method of forming a micro light-emitting element on a substrate according to an example embodiment.
Figure 22:
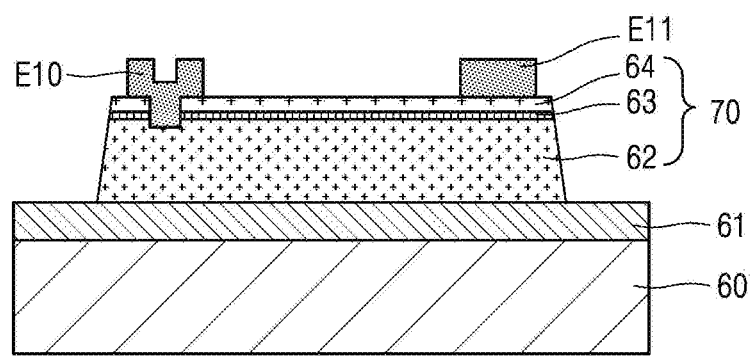
FIGS. 22 to 24 are diagrams for explaining a method of forming a micro light-emitting structure on a substrate according to an example embodiment.
Figure 23:
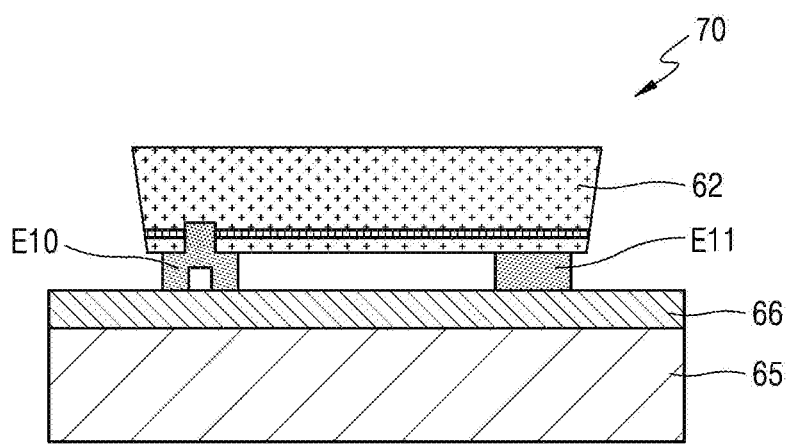
Figure 24:
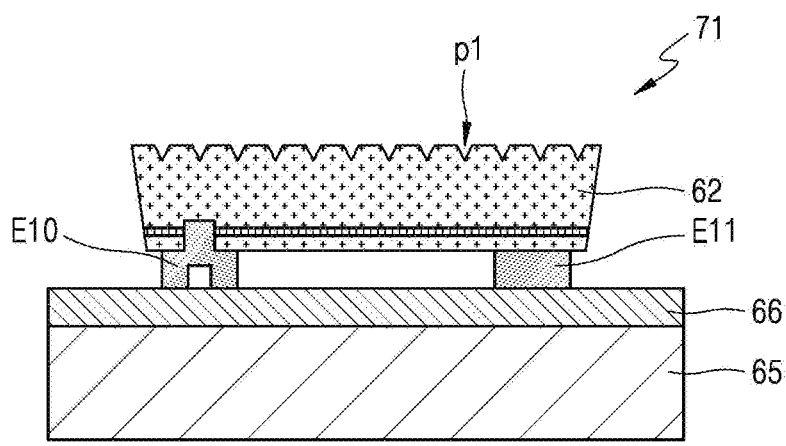
Figure 25:
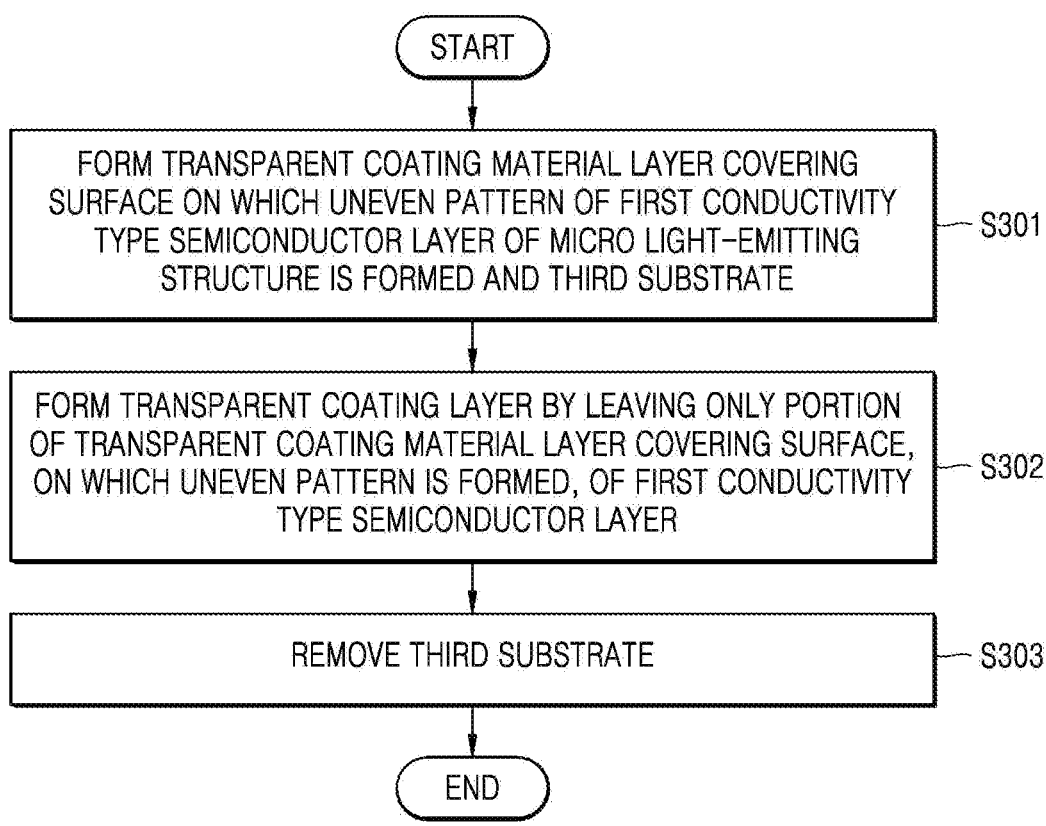
FIG. 25 is a flowchart of a method of forming a transparent coating layer on a micro light-emitting structure according to an example embodiment.

FIG. 21 is a flowchart of a method of forming a micro light-emitting element on a substrate according to an example embodiment. FIGS. 22 to 24 are diagrams for explaining a method of forming a micro light-emitting structure on a substrate according to an example embodiment. FIG. 25 is a flowchart of a method of forming a transparent coating layer on a micro light-emitting structure according to an example embodiment. FIGS. 26 to 29 are diagrams for explaining a method of forming a transparent coating layer on a micro light-emitting structure according to an example embodiment. FIG. 30 is a flowchart of a method of forming a transparent coating layer on a micro light-emitting structure according to another example embodiment. FIGS. 31 to 36 are diagrams for explaining a method of forming a transparent coating layer on a micro light-emitting structure according to another example embodiment.

Referring to FIG. 21, the method of manufacturing a plurality of micro light-emitting elements according to an example embodiment may include forming a micro light-emitting structure by sequentially stacking a first conductivity type semiconductor layer, an active layer, and a second conductivity type semiconductor layer on a second substrate and forming an electrode on the second conductivity type semiconductor layer (S201), separating the micro light-emitting structure from the second substrate, and moving the micro light-emitting structure to a third substrate so that the electrode of the micro light-emitting structure is in contact with a surface of the third substrate (S202), forming an uneven pattern on an exposed surface of the first conductivity type semiconductor layer of the micro light-emitting structure (S203) and forming a transparent coating layer covering a surface on which the uneven pattern of the first conductivity type semiconductor layer of the micro light-emitting structure is formed (S204).

Referring to FIG. 22, in operation of forming the micro light-emitting structure and the electrode (S201), a micro light-emitting structure 70 may be formed by sequentially stacking a first conductivity type semiconductor layer 62, an active layer 63, and a second conductivity type semiconductor layer 64 on a second substrate 60. Materials included in the first conductivity type semiconductor layer 62, the active layer 63, and the second conductivity type semiconductor layer 64 included in the micro light-emitting structure 70 are substantially the same as the materials included in the first conductivity type semiconductor layer 30, the active layer 20, and the second conductivity type semiconductor layer 10 included in the micro light-emitting structure ELS1 of FIG. 4, and thus, the description thereof will be omitted. An adhesive layer 61 may further be formed between the second substrate 60 and the micro light-emitting structure 70.

In addition, a first electrode E10 electrically connected to the first conductivity type semiconductor layer 62 and a second electrode E11 electrically connected to the second conductivity type semiconductor layer 64 may be formed on the micro light-emitting structure 70. For example, the first electrode E10 may be formed to penetrate the second conductivity type semiconductor layer 64 and the active layer 63 and extend to a partial region of the first conductivity type semiconductor layer 62. Accordingly, the first electrode E10 may be electrically connected to the first conductivity type semiconductor layer 62. The second electrode E11 may be provided on the second conductivity type semiconductor layer 64 to be separated from the first electrode E10.

Referring to FIG. 23, in the operation of moving the micro light-emitting structure 70 to the third substrate 65 (S202), after separating the micro light-emitting structure 70 from the second substrate 60, the micro light-emitting structure 70 may be moved to a third substrate 65 so that the first electrode E10 and the second electrode E11 provided on the second conductivity type semiconductor layer 64 face a surface of the third substrate 65 different from the second substrate 60. An adhesive layer 66 may further be formed between the third substrate 65 and the micro light-emitting structure 70.

Referring to FIG. 24, in the operation of forming the uneven pattern (S203), an uneven pattern p1 may be formed on an exposed surface of the first conductivity type semiconductor layer 62 facing the second conductivity type semiconductor layer 64 that faces the third substrate 65. For example, the uneven pattern p1 may be formed on the exposed surface of the first conductivity type semiconductor layer 62 so that the exposed surface of the first conductivity type semiconductor layer 62 has a surface roughness of several tens of nm RMS to several tens of μm RMS. The extraction efficiency of light emitted from the active layer 63 may be improved by the uneven pattern p1 formed on the first conductivity type semiconductor layer 62. Accordingly, a micro light-emitting structure 71 including the uneven pattern p1 may be formed.

Referring to FIGS. 25 to 29, the operation of forming a transparent coating layer covering a surface of the first conductivity type semiconductor layer 62 on which the uneven pattern p1 is formed (S204) may include forming transparent coating material layers 80, 81, 82, and 83 covering a surface of the micro light-emitting structure 71 on which the uneven pattern p1 of the first conductivity type semiconductor layer 62 is formed and a third substrate 65 (S301), forming a transparent coating layer 84 by leaving only a portion of the transparent coating material layers 80, 81, 82, and 83 covering the surface of the first conductivity type semiconductor layer 62 on which the uneven pattern p1 is formed (S302), and removing the third substrate 65 (S303).

Figure 26:
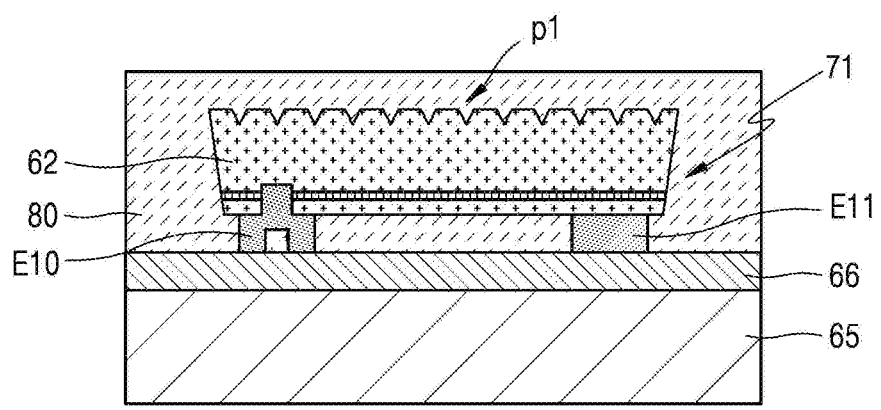
FIGS. 26 to 29 are diagrams for explaining a method of forming a transparent coating layer on a micro light-emitting structure according to an example embodiment.

Referring to FIG. 26, in the operation of forming the transparent coating material layer 80 covering the surface of the first conductivity-type semiconductor layer 62 on which the uneven pattern p1 is formed and the third substrate 65 (S301), the transparent coating material layer 80 covering the micro light-emitting structure 71 may be formed on the third substrate 65. For example, the transparent coating material layer 80 may include any one of polyimide (PI), spin-on-glass (SOG), photoresist, silicon oxide, and silicon nitride. Here, the spin-on glass may include hydrogen silsesquioxane (HSQ). However, the example embodiment is not limited thereto, and the transparent coating material layer 80 may include various materials having light transmittance other than the various materials described above.

Figure 27:
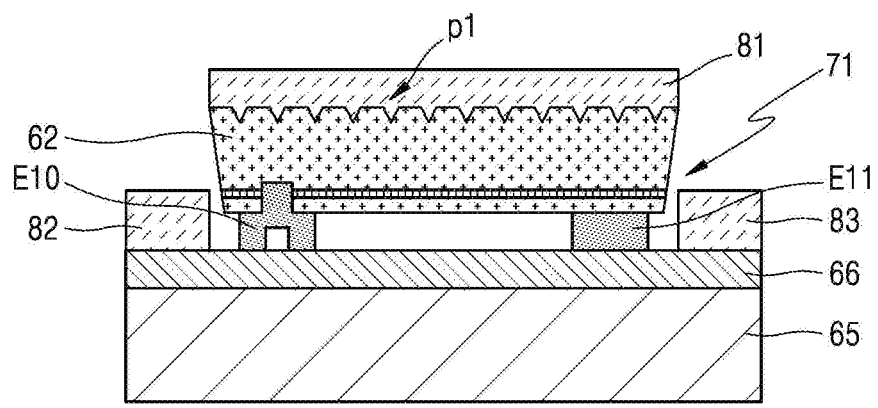

However, the example embodiment is not limited thereto, and as such, according to another example embodiment, referring to FIG. 27, in the operation of forming the transparent coating material layers 81, 82, and 83 covering the surface of the first conductivity-type semiconductor layer 62 on which the uneven pattern is formed and the third substrate 65 (S301), the transparent coating material layers 81, 82, and 83 covering only a region of the substrate 65 on which the micro light-emitting structure 71 is not formed and the uneven pattern p1 of the micro light-emitting structure 71 may be formed. For example, through a deposition process, the transparent coating material layers 81, 82, and 83 covering only the region of the substrate 65 on which the micro light-emitting structure 71 is not formed and the uneven pattern p1 of the micro light-emitting structure 71 may be formed. The transparent coating material layers 81, 82, and 83 of FIG. 27 may include substantially the same material as the transparent coating material layer 80 of FIG. 26.

Figure 28:
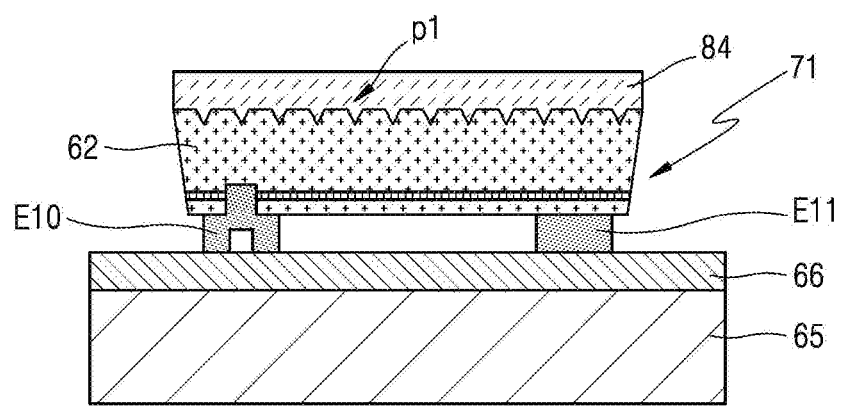

Referring to FIG. 28, in the operation of forming the transparent coating layer 84 (S302), the transparent coating layer 84 may be formed by leaving only the portion of the transparent coating material layers 80, 81, 82, and 83 covering surface of the first conductive type semiconductor layer 62 on which the uneven pattern p1 is formed.

Figure 29:
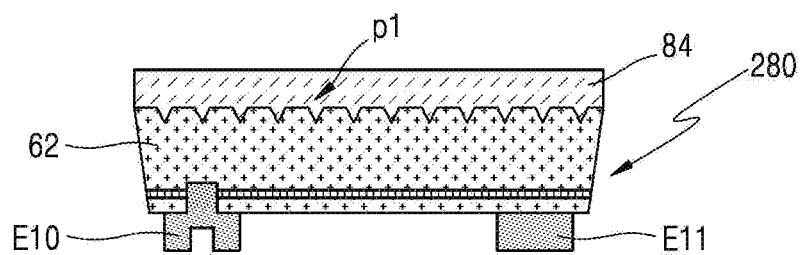
Figure 30:
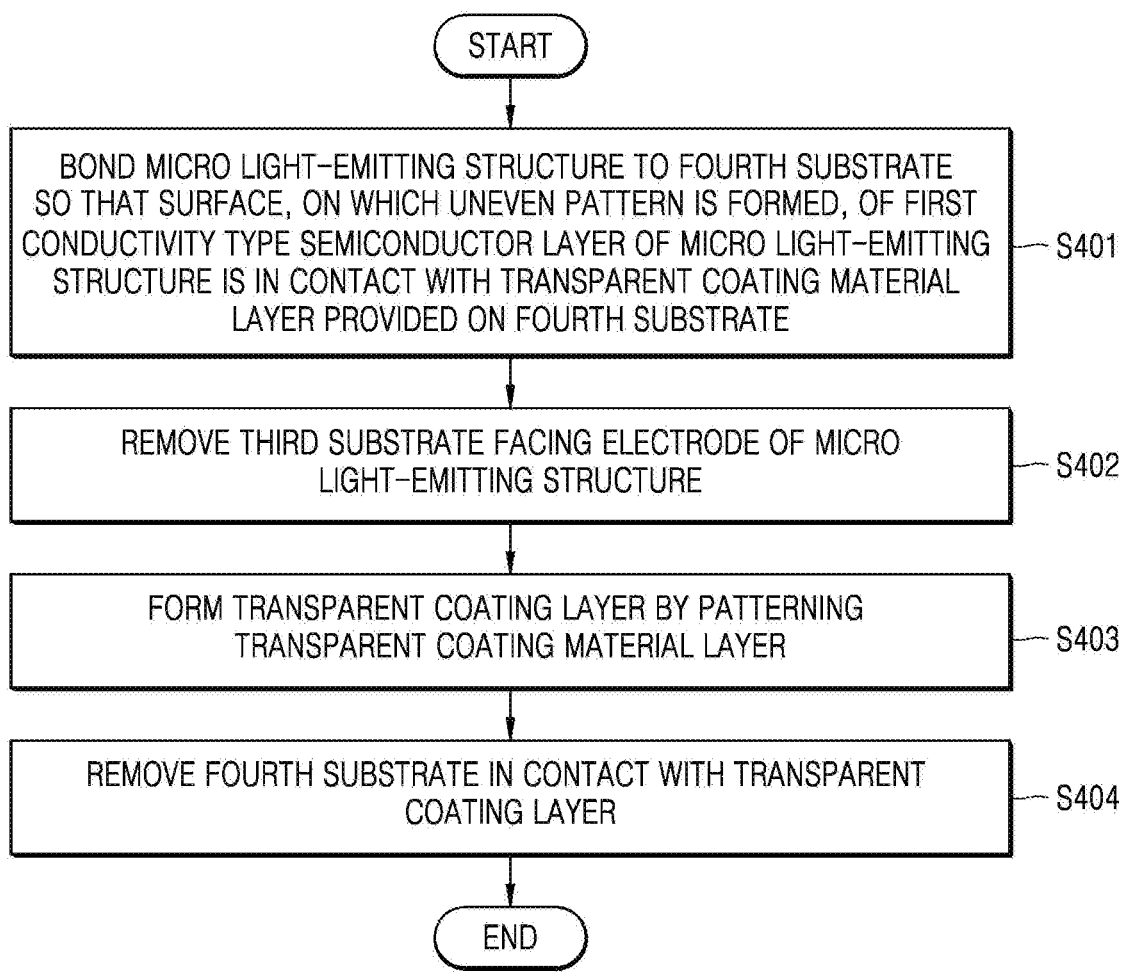
FIG. 30 is a flowchart of a method of forming a transparent coating layer on a micro light-emitting structure according to another example embodiment.

Referring to FIG. 29, in the operation of removing the third substrate 65 (S303), a micro light-emitting element 280 may be formed by separating the micro light-emitting structure 71 from the third substrate 65. In this case, the micro light-emitting structure 71 in contact with the adhesive layer 66 may be separated from the adhesive layer 66.

The embodiment of the operation (S204) of forming the transparent coating layer has been described with reference to FIGS. 25 to 29. Hereinafter, another example embodiment of the operation (S204) of forming a transparent coating layer will be described with reference to FIGS. 30 to 33.

Referring to FIGS. 30 to 33, the operation of forming a transparent coating layer covering the surface of the first conductivity type semiconductor layer 62 on which uneven pattern p1 is formed (S204) may include bonding the micro light-emitting structure 71 to a fourth substrate 67 so that the surface of the micro light-emitting structure 71 on which the uneven pattern p1 of the type semiconductor layer 62 is formed is in contact with a transparent coating material layer 68 provided on the fourth substrate 67 (S401), removing the third substrate 65 facing the electrodes E10 and E11 of the micro light-emitting structure 71 (S402), forming a transparent coating layer 69 by patterning the transparent coating material layer 68 (S403), and removing the fourth substrate 67 in contact with the transparent coating layer 69 (S404).

Figure 31:
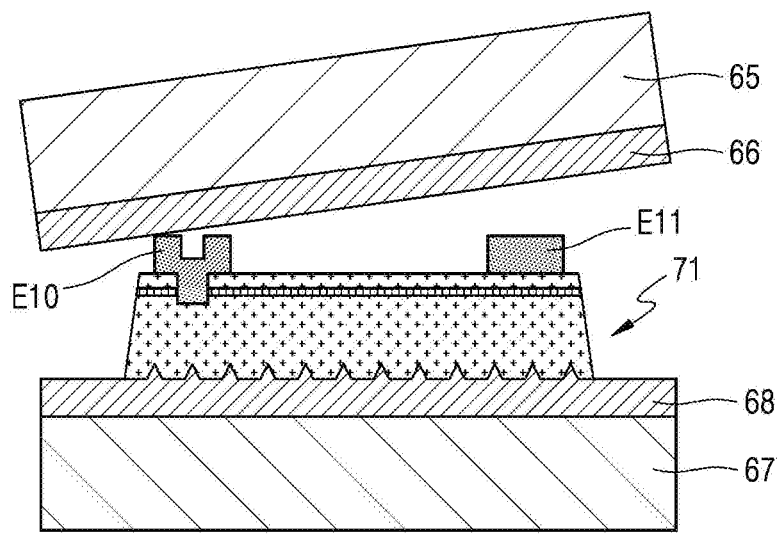
FIGS. 31 to 36 are diagrams for explaining a method of forming a transparent coating layer on a micro light-emitting structure according to another example embodiment.

Referring to FIG. 31, in the operation of bonding the micro light-emitting structure 71 to the fourth substrate 67 (S401), the surface of the micro light-emitting structure 71 on which the uneven pattern p1 is formed may face an upper surface of the fourth substrate 67. The transparent coating material layer 68 may be provided on an upper surface of the fourth substrate 67. For example, the transparent coating material layer 68 may include any one of polyimide (PI), spin-on-glass (SOG), photoresist, silicon oxide, and silicon nitride. Here, the spin-on glass may include hydrogen silsesquioxane (HSQ). However, the example embodiment is not limited thereto, and the transparent coating material layer 68 may include various materials having light transmittance other than the various materials described above.

In this case, the fourth substrate 67 may include a glass substrate or a semiconductor substrate having an upper surface roughness of 5 nm RMS or less. Preferably, the surface roughness of the upper surface of the fourth substrate 67 may be 2 nm RMS or less. Accordingly, the surface of the transparent coating material layer 68 provided on the upper surface of the fourth substrate 67 in contact with the fourth substrate 67 has a surface roughness of 5 nm RMS or less (preferably 2 nm RMS or less).

The surface of the micro light-emitting structure 71 on which the uneven pattern p1 is formed may be brought into contact with the transparent coating material layers 68 provided on the upper surface of the fourth substrate 67 by applying pressure to the micro light-emitting structure 71 facing the upper surface of the fourth substrate 67. In this case, the transparent coating material layer 68 may be filled between the uneven patterns p1 of the micro light-emitting structure 71.

After bonding the micro light-emitting structure 71 to the fourth substrate 67, the third substrate 65 and the adhesive layer 66 facing the electrodes E10 and E11 of the micro light-emitting structure 71 may be removed together.

Figure 32:
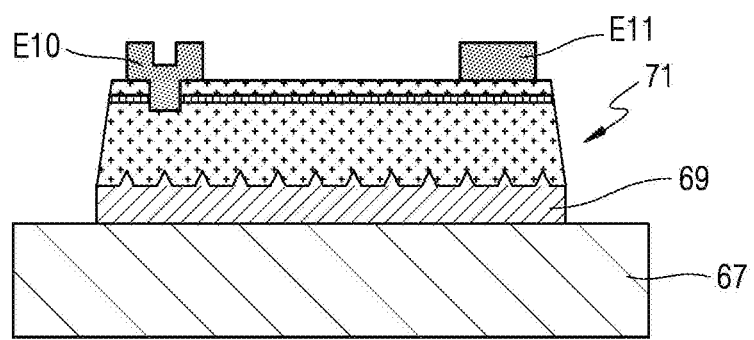

Referring to FIG. 32, in the operation of forming the transparent coating layer 69 by patterning the transparent coating material layer 68 (S403), the transparent coating layer 69 may be formed by patterning the transparent coating material layer 68 through a photolithography process and an etching process, etc. In this case, the transparent coating layer 69 may be formed by patterning the transparent coating material layer 68 so that only a region of the transparent coating material layer 68 corresponding to the uneven pattern p1 of the micro light-emitting structure 71 remains.

Figure 33:
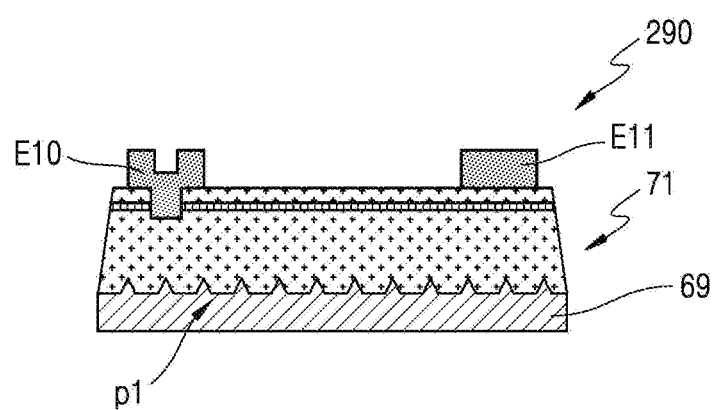

Referring to FIG. 33, in the operation of removing the fourth substrate 67 in contact with the transparent coating layer 69 (S404), a micro light-emitting element 290 may be formed by separating the micro light-emitting structure 71 from the fourth substrate 67. In this case, the micro light-emitting element 290 may be formed by separating the micro light-emitting structure 71 from the fourth substrate 67 through a release process with respect to a contact surface between the transparent coating layer 69 and the fourth substrate 67. In this case, various release process methods, such as a release process using a laser, a thermal release process, and a mechanical release process may be used.

In FIGS. 25 to 29, the operation (S204) of forming the transparent coating layer have been described according to an example embodiment, and in FIGS. 30 to 33, the operation (S204) of forming the transparent coating layer have been described according to another example embodiment. Hereinafter, yet another example embodiment of the operation (S204) of forming a transparent coating layer will be described with reference to FIGS. 34 to 36.

Referring to FIGS. 30 and 34 to 36, the operation of forming a transparent coating layer covering the surface of the first conductivity type semiconductor layer 62 on which the uneven pattern p1 is formed (S204) may include bonding the micro light-emitting structure 71 to a fourth substrate 90 so that the surface of the micro light-emitting structure 71 on which the uneven pattern p1 of the semiconductor layer 62 is formed is in contact with a transparent coating material layer 91 provided on the fourth substrate 90 (S401), removing the third substrate 65 facing the electrodes E10 and E11 of the micro light-emitting structure 71 (S402), forming a transparent coating layer 92 by patterning the transparent coating material layer 91 (S403), and removing the fourth substrate 90 in contact with the transparent coating layer 92 (S404).

Figure 34:
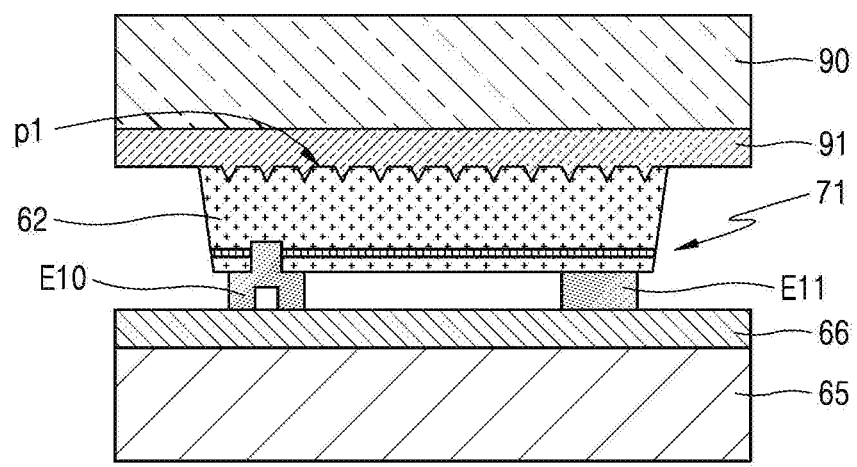

Referring to FIG. 34, in the operation of bonding the micro light-emitting structure 71 to the fourth substrate 90 (S401), the surface of the micro light-emitting structure 71 on which the uneven pattern p1 is formed may be formed to face an upper surface of the fourth substrate 90. The transparent coating material layer 91 may be provided on the upper surface of the fourth substrate 90. For example, the transparent coating material layer 91 may include any one of polyimide (PI), spin-on-glass (SOG), photoresist, silicon oxide, and silicon nitride. Here, the spin-on glass may include hydrogen silsesquioxane (HSQ). However, the example embodiment is not limited thereto, and other than the various materials listed above, the transparent coating material layer 91 may include various materials having light transmittance.

In this case, the fourth substrate 90 may include a glass substrate, a semiconductor substrate, or a release film having an upper surface roughness of 5 nm RMS or less. Preferably, the surface roughness of the upper surface of the fourth substrate 90 may be 2 nm RMS or less. Accordingly, the surface of the transparent coating material layer 91 provided on the upper surface of the fourth substrate 90 in contact with the fourth substrate 90 has a surface roughness of 5 nm RMS or less (preferably 2 nm RMS or less).

The surface of the micro light-emitting structure 71 on which the uneven pattern p1 is formed may be brought into contact with the transparent coating material layer 91 provided on the upper surface of the fourth substrate 90 by applying pressure to the fourth substrate 90 facing the micro light-emitting structure 71. In this case, the transparent coating material layer 91 may be filled between the uneven patterns p1 of the micro light-emitting structure 71.

Figure 35:
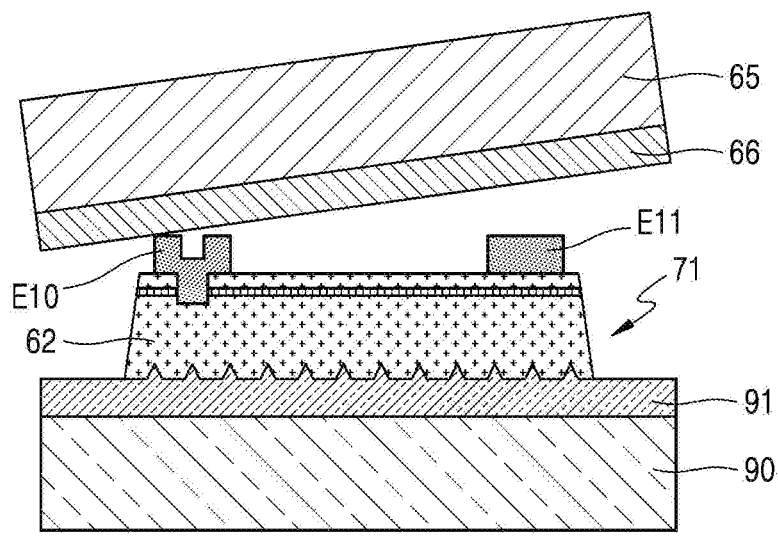
Figure 36:
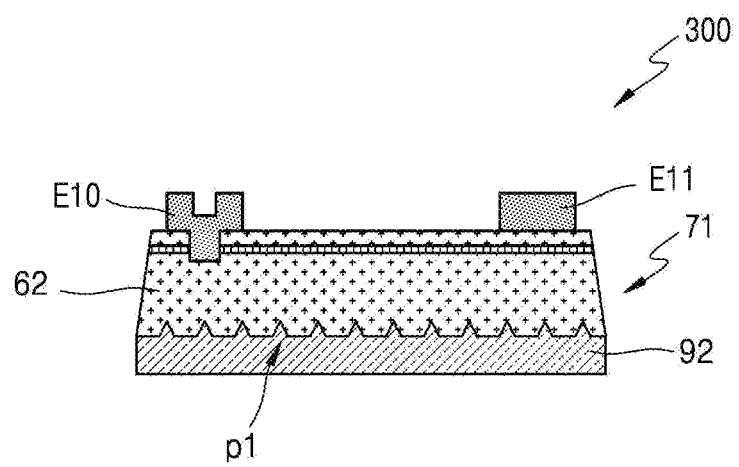

Referring to FIG. 35, after bonding the micro light-emitting structure 71 to the fourth substrate 90, the third substrate 65 facing the electrodes E10 and E11 of the micro light-emitting structure 71 and the adhesive layer (66) may be removed together Referring to FIG. 36, in the operation of forming the transparent coating layer 92 by patterning the transparent coating material layer 91 (S403), the transparent coating layer 92 may be formed by patterning the transparent coating material layer 91 through a photolithography process and an etching process, etc. In this case, the transparent coating layer 92 may be formed by patterning the transparent coating material layer 91 so that only a region of the transparent coating material layer 91 corresponding to the uneven pattern p1 of the micro light-emitting structure 71 remains.

In addition, in the operation of removing the fourth substrate 90 in contact with the transparent coating layer 92 (S404), a micro light-emitting element 300 may be formed by separating the micro light-emitting structure 71 from the fourth substrate 90. In this case, the micro light-emitting element 300 may be formed by separating the micro light-emitting structure 71 from the fourth substrate 90 through a release process with respect to a contact surface between the transparent coating layer 92 and the fourth substrate 90. In this case, various release process methods, such as a release process using a laser, a thermal release process, and a mechanical release process may be used.

According to another example embodiment, a micro light-emitting element may include a first conductivity type semiconductor layer including a lower surface on which an uneven pattern is formed, the lower surface of the first conductivity type semiconductor layer having a first characteristic configured to apply a first Van der Waals force, an active layer provided on the first conductivity type semiconductor layer, a second conductivity type semiconductor layer provided on the active layer, at least one electrode provided on the second conductivity type semiconductor layer; and a transparent coating layer including: a first surface covering one of the lower surface of the first conductivity type semiconductor layer or an upper surface of the second conductivity type semiconductor layer, and a second surface having a second characteristic configured to apply a second Van der Waals force greater than the first Van der Waals force.

According to an example embodiment, the first characteristic may be a first surface roughness of the lower surface of the first conductivity type semiconductor layer, and the second characteristic may be a second surface roughness of the second surface of the transparent coating layer. However, the disclosure is not limited thereto, and as such, according to another example embodiment, a characteristics of the surface, which affects that Van der Waals force, other than surface roughness, may be considered in forming the transparent coating layer.

Figure 37:
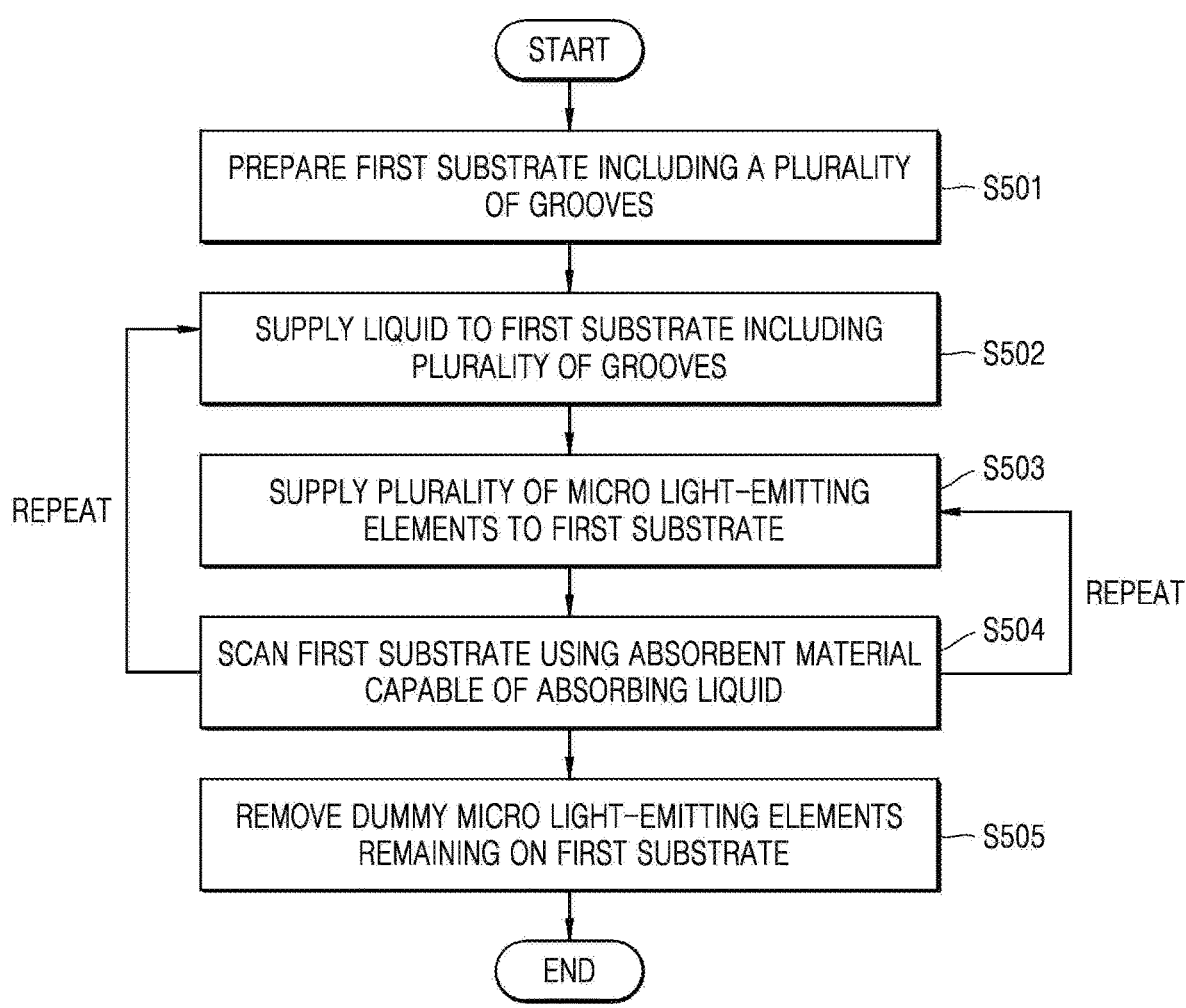
FIG. 37 is a flowchart of a method of manufacturing a micro light-emitting element array according to another example embodiment.
Figure 38:
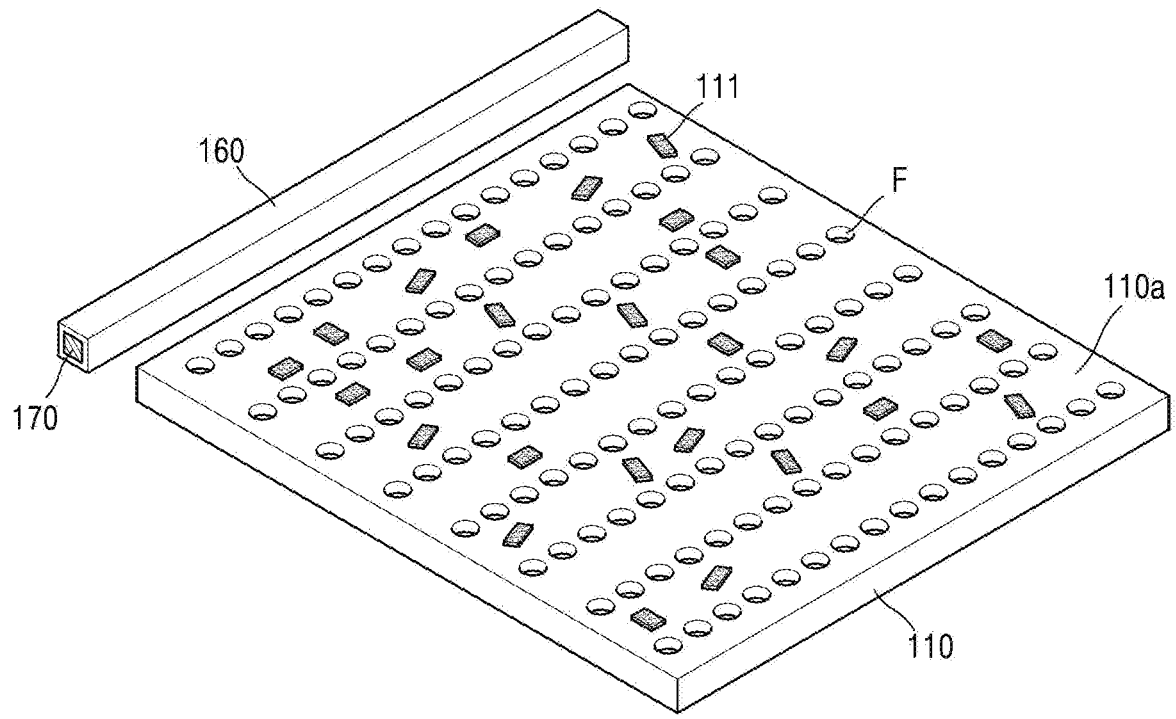
FIG. 38 is a schematic diagram illustrating a configuration of a first substrate, a plurality of micro light-emitting elements, and an absorbent material used in the method of manufacturing the micro light-emitting element array of FIG. 37 according to an example embodiment.
Figure 39:
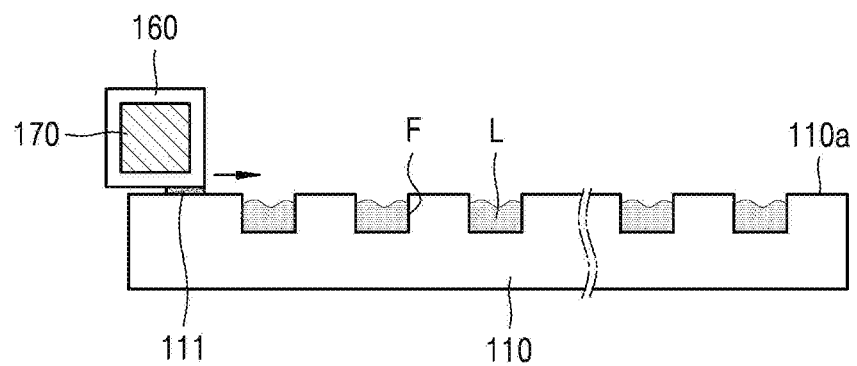
FIG. 39 is a diagram illustrating a scanning process of a method of manufacturing a micro light-emitting element array according to an example embodiment.
Figure 40:
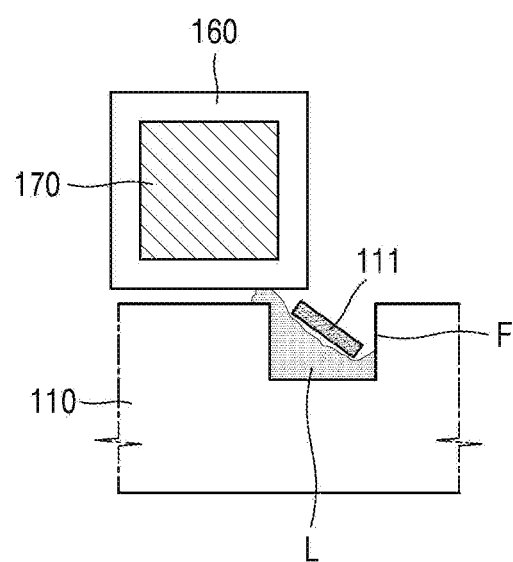
FIG. 40 is a diagram for describing a process in which any one of a plurality of micro light-emitting elements is aligned on a first substrate according to a method of manufacturing a micro light-emitting element array according to an example embodiment.

FIG. 37 is a flowchart of a method of manufacturing a micro light-emitting element array according to another example embodiment. FIG. 38 is a schematic diagram illustrating a configuration of the first substrate 110, the plurality of micro light-emitting elements 111, and an absorbent material 160 used in the method of manufacturing the micro light-emitting element array of FIG. 37. FIG. 39 is a diagram illustrating a scanning process of a method of manufacturing a micro light-emitting element array according to an example embodiment. FIG. 40 is a diagram for explaining a process in which any one of the plurality of micro light-emitting elements 111 is aligned on the first substrate 110 according to a method of manufacturing a micro light-emitting element array according to an example embodiment.

The method of manufacturing a micro light-emitting element array described with reference to FIGS. 37 to 40 is a method of aligning a plurality of micro light-emitting elements 111 in a first region of the first substrate 110 by using a wet alignment method.

Referring to FIGS. 37 to 40, in manufacturing the micro light-emitting element array, first, the first substrate 110 including a plurality of grooves F formed on a first surface 110a is prepared (S501). The first substrate 110 may be the transfer substrate in a mold form of FIG. 6. However, the example embodiment is not limited thereto, and the first substrate 110 may include any one of the substrate 100 of FIG. 3, the driving circuit board 140 of FIG. 17, and the driving circuit board 150 of FIG. 19. Hereinafter, a case in which the first substrate 110 is a transfer substrate in the form of a mold will be described.

The first substrate 110 may be provided as a single layer or may include a plurality of layers. The plurality of grooves F may be provided for disposing the plurality of micro light-emitting elements 111. Each of the plurality of micro light-emitting elements 111 may have a size less than a size of the plurality of grooves F included in the first substrate 110. For example, the size of the plurality of micro light-emitting elements 111 may be less than a diameter of the plurality of grooves F. Cross-sections of the plurality of grooves F may have various shapes, such as a circle, a rectangle, and a square.

Second, a liquid and a plurality of micro light-emitting elements 111 are supplied on the first surface 110a of the first substrate 110 (S502 and S503). Any type of liquid may be used as the liquid as long as it does not corrode or damage the plurality of micro light-emitting elements 111. The liquid may include at least one of a group consisting of, for example, water, ethanol, alcohol, polyol, ketone, halocarbon, acetone, a flux, or an organic solvent. The organic solvent may include, for example, isopropyl alcohol (IPA). The liquid is not limited thereto, and various modifications are possible. The liquid may be supplied to fit the groove F, or the liquid may be supplied to overflow from the grooves F. The supply amount of the liquid may be variously adjusted.

The plurality of micro light-emitting elements 111 may include the plurality of micro light-emitting elements 200, 210, 220, 230, 240, 250, 260, 270 according to various embodiments described with reference to FIGS. 1 to 19.

The operation of supplying the liquid to the first substrate 110 (S502) may be performed before the operation (S503) of supplying the plurality of micro light-emitting elements 111 to the first substrate 110, or may be performed in a reverse order. However, the example embodiment is not limited thereto, and the operation of supplying the liquid to the first substrate 110 (S502) and the supplying of the plurality of micro light-emitting elements 111 to the first substrate 110 (S503) may simultaneously perform.

A method of supplying the plurality of micro light-emitting elements 111 to the first substrate 110 may be variously used, such as a spray method, a dispensing method, an inkjet dot method, a method of flowing a suspension onto the first substrate 110, and the like. The method of supplying the plurality of micro light-emitting elements 111 to the first substrate 110 is not limited thereto and may be variously modified.

Third, the first substrate 110 is scanned with the absorbent material 160 capable of absorbing the liquid (S504). The absorbent material 160 may include any material capable of absorbing a liquid, and the shape or structure thereof is not limited. The absorbent material 160 may include, for example, fabric, tissue, polyester fiber, paper, or a wiper. The absorbent material 160 may be used alone without other auxiliary elements. However, the example embodiment is not limited thereto, and as shown in FIG. 38, the absorbent material 160 may be coupled to a support 170 so as to conveniently scan the first substrate 110 with the absorbent material 160. The support 170 may have various shapes and structures suitable for scanning the first substrate 110. The support 170 may include, for example, a load, a blade, a plate, or a wiper. The absorbent material 160 may be provided on one side of the support 170, or may have a shape in which the absorbent material 160 is wound around the support 170.

The absorbent material 160 may scan the first substrate 110 while pressing the first substrate 110 to an appropriate pressure. The scanning may include an operation of allowing the absorbent material 160 to contact the first substrate 110 and pass through the plurality of grooves F. The liquid may be absorbed by the absorbent material 160 while scanning. The scanning may be performed in various ways including at least one of, for example, a sliding method, a rotating method, a translating motion method, a reciprocating motion method, a rolling method, a spinning method, or a rubbing method of the absorbent material 160, may include both a regular method and an irregular method. Alternatively, the scanning may include at least one of a rotational motion, a translational motion, a rolling motion, or a spinning motion of the transfer substrate 101. Alternatively, the scanning may be performed by cooperation between the absorbent material 160 and the first substrate 110.

Scanning the first substrate 110 with the absorbent material 160 may include absorbing the liquid in the plurality of grooves F while the absorbent material 160 passes through the plurality of grooves F. When the absorbent material 160 scans the first substrate 110, a plurality of micro light-emitting elements 111 may be attached to the absorbent material 160. In addition, the absorbent material 160 may pass through the plurality of grooves F in contact with the first substrate 110.

Referring to FIG. 39, the absorbent material 160 may be provided on a surface of the support 170, and scanning may be performed while the absorbent material 160 is in contact with the surface of the first substrate 110. When the absorbent material 160 is scanned, the plurality of micro light-emitting elements 111 may be absorbed or attached to a surface of the absorbent material 160, and the micro light-emitting elements 111 may be pushed forward by the absorbent material 160. The micro light-emitting element 111 may be positioned between the absorbent material 160 and the first substrate 110.

FIG. 40 is an enlarged view of the groove F. At least one of the plurality of micro light-emitting elements 111 moved by the absorbent material 160 may enter the groove F. Here, the absorbent material 160 may absorb the liquid L in the groove F, and any one of the plurality of micro light-emitting elements 111 may enter the groove F.

Referring back to FIG. 37, at least one of operations S502, S503, and S504 may be repeated as necessary until the plurality of micro light-emitting elements 111 are all transferred to the plurality of grooves F of the first substrate 110. For example, after scanning the first substrate 110 with the absorbent material 160, if the liquid does not exist or is insufficient in the groove F, the operation of supplying the liquid to the groove F (S502) may further be performed. Here, if the plurality of micro light-emitting elements 111 are sufficient on the first substrate 110, it is also possible to proceed from operation S502 to operation S504 without performing operation S503. Alternatively, if an excessive amount of liquid is supplied to the first substrate 110, some liquid may be removed by using a blade as needed.

Alternatively, after scanning the first substrate 110 with the absorbent material 160, when an amount of the plurality of micro light-emitting elements 111 is insufficient on the first substrate 110, the operation of supplying (S503) the plurality of micro light-emitting elements 111 to the first substrate 110 may further be performed.

Next, after all the plurality of micro light-emitting elements 111 are transferred to the first substrate 110, dummy micro light-emitting elements remaining on the first substrate 110 are removed (S505).

Through the above process, the plurality of micro light-emitting elements 111 may be aligned on the first substrate 110.

Figure 41:
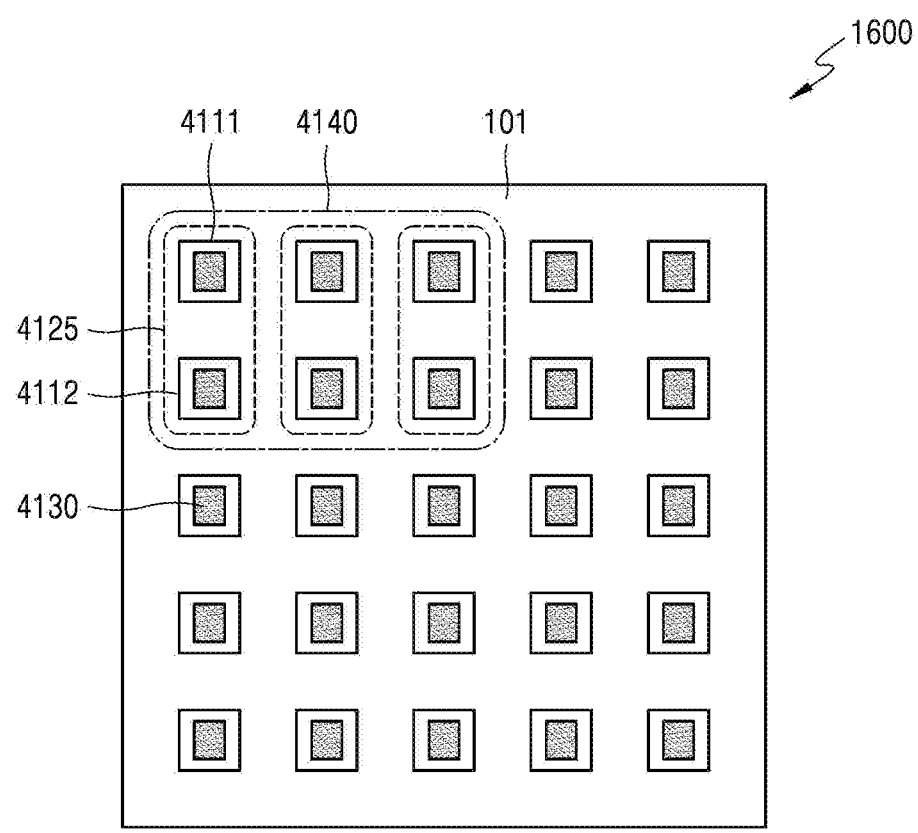
FIG. 41 is a diagram schematically illustrating an arrangement structure of a plurality of micro light-emitting elements included in the micro light-emitting element array according to an example embodiment.
Figure 42:
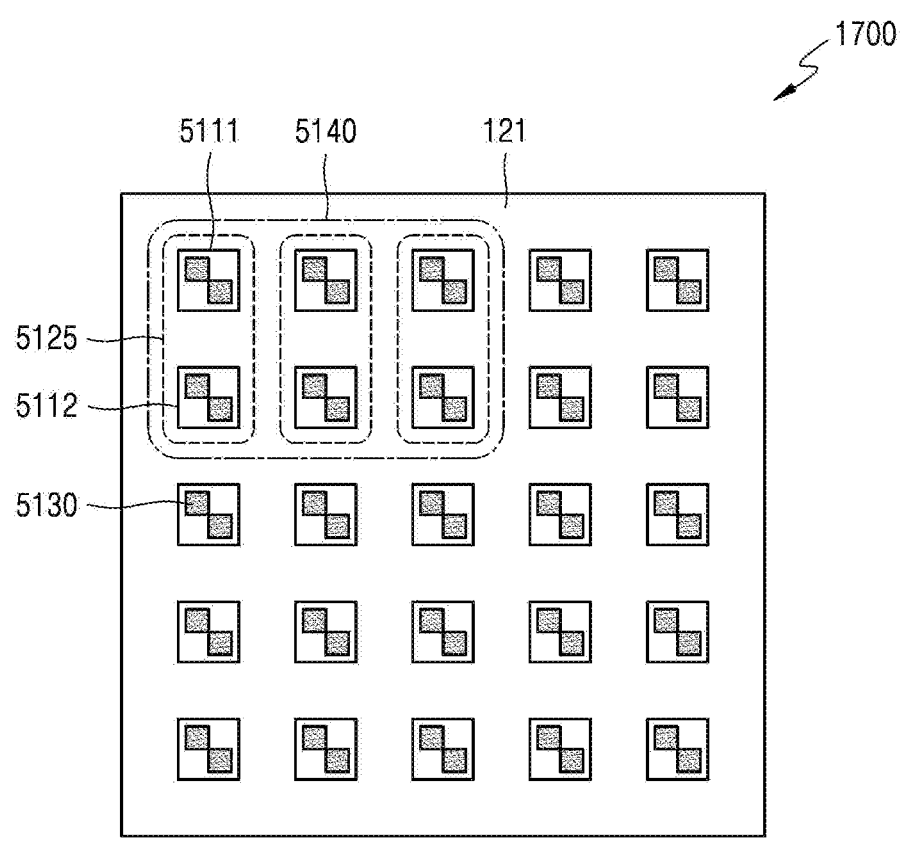
FIG. 42 is a diagram schematically illustrating an arrangement structure of a plurality of micro light-emitting elements included in a micro light-emitting element array according to another example embodiment.

FIG. 41 is a diagram schematically illustrating an arrangement structure of a plurality of micro light-emitting elements 4130 included in the micro light-emitting element array 1600 according to an example embodiment. FIG. 42 is a diagram schematically illustrating an arrangement structure of a plurality of micro light-emitting elements 5130 included in the micro light-emitting element array 1700 according to another example embodiment.

Referring to FIG. 41, the micro light-emitting element array 1600 according to an example embodiment may include a first substrate 101 including a plurality of grooves and the micro light-emitting elements 4130 provided in the plurality of grooves. In the example embodiment, the first substrate 101 may include a plurality of regions 4125 corresponding to sub-pixels, and each of the plurality of regions 4125 may include a plurality of grooves.

A pixel may represent a basic unit for displaying a color in a display device. Reference numeral 4140 denotes a region corresponding to a pixel. For example, one pixel may include a first color light, a second color light, and a third color light. For example, the first color light may include red light, the second color light may include green light, and the third color light may include blue light. The pixel may include a plurality of sub-pixels emitting each color light. For example, the pixel may include a first sub-pixel emitting a first color light, a second sub-pixel emitting a second color light, and a third sub-pixel emitting a third color light. One or more micro light-emitting elements 4130 may be provided in the region 4125 corresponding to each sub-pixel. Here, the micro light-emitting element 4130 may include any one of the plurality of micro light-emitting elements 200, 210, 220, 230, 240, 250, 260, and 270 according to various embodiments described with reference to FIGS. 1 to 19.

For example, the first substrate 101 may include a first groove 4111 and a second groove 4112 in the plurality of regions 4125, respectively. A micro light-emitting element 4130 may be provided in the first groove 4111 and the second groove 4112, respectively. However, there may be a case in which the micro light-emitting element 4130 is omitted in the region 4125 corresponding to each sub-pixel. For example, the micro light-emitting element 4130 may be provided in the first groove 4111, and the micro light-emitting element 4130 may be omitted in the second groove 4112. In this case, since the micro light-emitting element 4130 is provided in the first groove 4111, there is no problem in pixel operation.

In this way, when the plurality of grooves 4111 and 4112 are provided in the region 4125 corresponding to each sub-pixel, even if the micro light-emitting element 4130 is omitted from any one of the plurality of grooves 4111 and 4112, because the micro light-emitting element 4130 may be provided in the remaining grooves, an error rate may be reduced and a repair process may be omitted.

For example, the micro light-emitting element 4130 may have a size of 200 μm or less. Here, the size may represent a maximum diameter of a cross-section of the micro light-emitting element 4130. The cross-section may represent a cross-section perpendicular to a direction in which light from the micro light-emitting element 4130 is emitted. The micro light-emitting element 4130 may have various shapes, such as a triangular cross-section, a square cross-section, and a circular cross-section. The grooves 4111 and 4112 may have, for example, a size capable of accommodating the micro light-emitting elements 4130. The grooves 4111 and 4112 may have various shapes, such as a triangular cross-section, a square cross-section, a circular cross-section, etc.

Meanwhile, referring to FIG. 42, a micro light-emitting element array 1700 according to another example embodiment includes a first substrate 121 including a plurality of grooves and micro light-emitting elements 5130 provided in the plurality of grooves. In the example embodiment, the first substrate 121 may include a plurality of regions 5125 corresponding to sub-pixels, and include a plurality of grooves 5111 and 5112 in the plurality of regions 5125, respectively. Here, the micro light-emitting element 5130 may include any one of the plurality of micro light-emitting elements 200, 210, 220, 230, 240, 250, 260, and 270 according to various embodiments described with reference to FIGS. 1 to 19.

The plurality of grooves 5111 and 5112 may have a size capable of accommodating the plurality of micro light-emitting elements 5130. Here, the size may represent a cross-sectional area of the groove.

For example, the first substrate 121 may include a first groove 5111 and a second groove 5112 in the plurality of regions 5125, respectively. The first groove 5111 and the second groove 5112 may have a size capable of accommodating two or more micro light-emitting elements 5130. For example, two micro light-emitting elements 5130 may enter the first groove 5111 and two micro light-emitting elements 5130 may enter the second groove 5112. In this way, the possibility of defects in each pixel due to omission of the micro light-emitting element 5130 may be reduced and a repair process may be omitted. Reference numeral 5140 denotes a region corresponding to a pixel.

Figure 43:
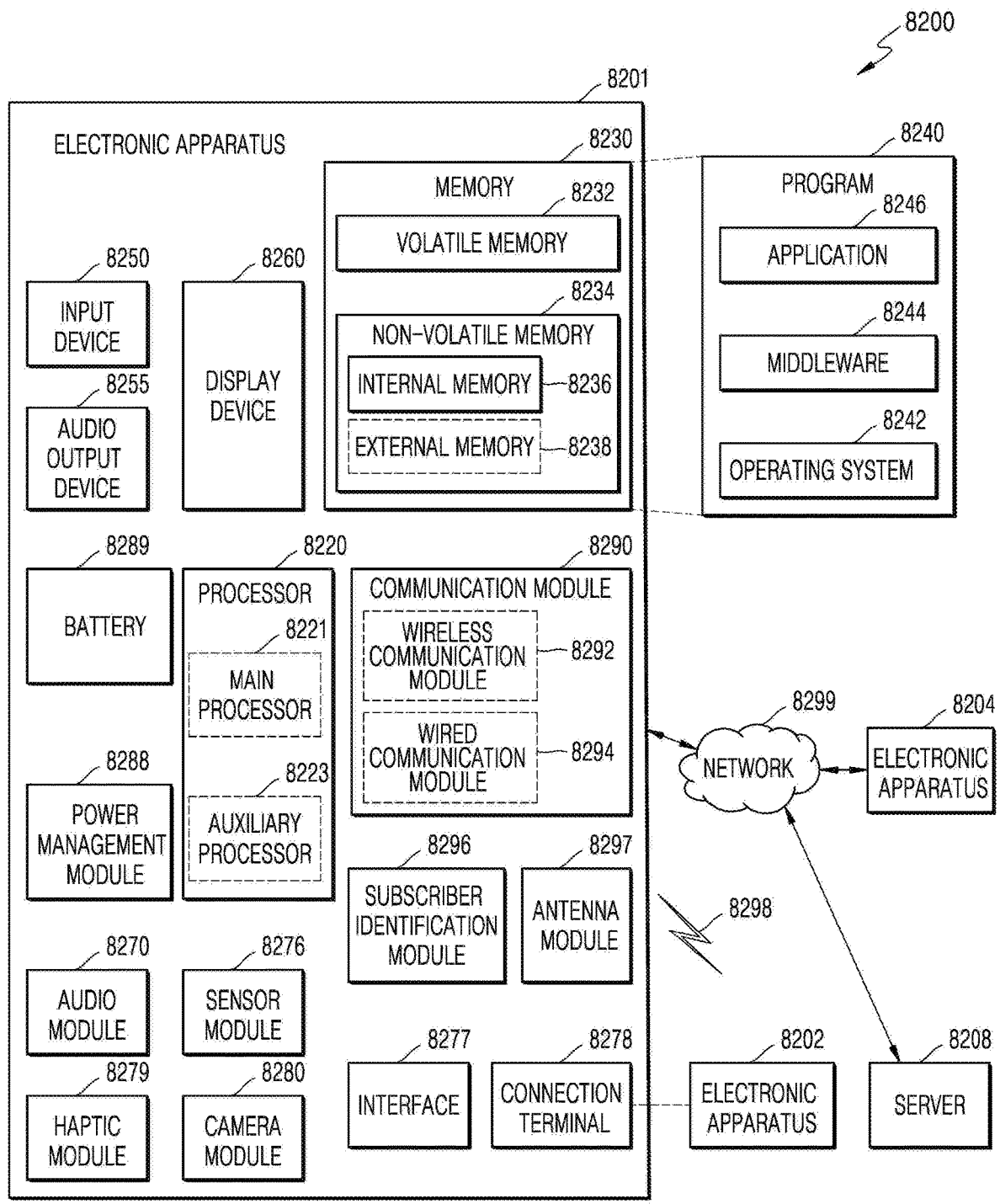
FIG. 43 is a schematic block diagram of an electronic apparatus according to an example embodiment.

FIG. 43 is a schematic block diagram of an electronic apparatus 8201 according to an example embodiment.

FIG. 43 is a block diagram of an electronic apparatus 8201 including a display device 8260 according to an example embodiment.

Referring to FIG. 43, the electronic apparatus 8201 may be provided in a network environment 8200. In the network environment 8200, the electronic apparatus 8201 may communicate with another electronic apparatus 8202 through a first network 8298 (a short-range wireless communication network, etc.), or may communicate with another electronic apparatus 8204 and/or a server 8208 through a second network 8299 (a long-distance wireless communication network, etc.). The electronic apparatus 8201 may communicate with the electronic apparatus 8204 through the server 8208. The electronic apparatus 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic apparatus 8201, some of these components may be omitted or other components may be added. Some of these components may be implemented as one integrated circuit. For example, the sensor module 8276 (a fingerprint sensor, an iris sensor, an illuminance sensor, etc.) may be implemented by being embedded in the display device 8260 (a display, etc.).

The processor 8220 may control one or a plurality of other components (hardware, software components, etc.) of the electronic apparatus 8201 connected to the processor 8220 and perform various data processing or computations by executing software (a program 8240, etc.). As part of data processing or computation, the processor 8220 may load commands and/or data received from other components (the sensor module 8276, the communication module 8290, etc.) into a volatile memory 8232, process the commands and/or data stored in 8232, and store resulting data in a non-volatile memory 8234. The processor 8220 may include a main processor 8221 (a central processing unit, an application processor, etc.) and an auxiliary processor 8223 (a graphic processing unit, an image signal processor, a sensor hub processor, a communication processor, etc.) that may be operated independently or together with the main processor 8221. The auxiliary processor 8223 may use less power than the main processor 8221 and may perform a specialized function.

The auxiliary processor 8223 may control functions and/or states related to some of the components (the display device 8260, the sensor module 8276, the communication module 8290, etc.) of the electronic apparatus 8201 on behalf of the main processor 8221 while the main processor 8221 is in an inactive state (a sleep state), or together with the main processor 8221 while the main processor 8221 is in an active state (an application execution state). The auxiliary processor 8223 (an image signal processor, a communication processor, etc.) may be implemented as a part of other functionally related components (the camera module 8280, the communication module 8290, etc.).

The memory 8230 may store various data required by components (the processor 8220, the sensor module 8276, etc.) of the electronic apparatus 8201. Data may include, for example, input data and/or output data for software (the program 8240, etc.) and instructions related the software. The memory 8230 may include a volatile memory 8232 and/or a non-volatile memory 8234.

The program 8240 may be stored as software in the memory 8230, and may include an operating system 8242, middleware 8244, and/or applications 8246.

An input device 8250 may receive a command and/or data to be used in a component (such as, the processor 8220) of the electronic apparatus 8201 from the outside of the electronic apparatus 8201 (e.g., a user). The input device 8250 may include a remote controller, a microphone, a mouse, a keyboard, and/or a digital pen (such as, a stylus pen).

An audio output device 8255 may output a sound signal to the outside of the electronic apparatus 8201. The audio output device 8255 may include a speaker and/or a receiver. The speaker may be used for general purposes, such as, multimedia playback or recording playback, and the receiver may be used to receive an incoming call. The receiver may be incorporated as a part of the speaker or may be implemented as an independent separate device.

The display device 8260 may visually provide information to the outside of the electronic apparatus 8201. The display device 8260 may include a control circuit for controlling a display, a hologram device, or a projector, and a corresponding device. The display device 8260 may include a micro light-emitting element array. For example, the display device 8260 may include various types of display devices including the micro light-emitting element arrays 1200, 1300, 1400, and 1500 described with reference to FIGS. 15, 16, 17, and 19. The display device 8260 may include a touch circuitry configured to sense a touch, and/or a sensor circuitry configured to measure the intensity of force generated by the touch (a pressure sensor, etc.).

The audio module 8270 may convert a sound into an electric signal or, conversely, convert an electric signal into a sound. The audio module 8270 may obtain a sound through the input device 8250 or output sound through a speaker and/or headphones of a sound output device 8255 and/or another electronic apparatus (the electronic apparatus 8202, etc.) directly or wirelessly connected to the electronic apparatus 8201

The sensor module 8276 may detect an operating state (power, temperature, etc.) of the electronic apparatus 8201 or an external environmental state (a user state, etc.), and generate an electrical signal and/or data value corresponding to the sensed state. The sensor module 8276 may include a gesture sensor, a gyro sensor, a barometric pressure sensor, a magnetic sensor, an acceleration sensor, a grip sensor, a proximity sensor, a color sensor, an IR (Infrared) sensor, a biometric sensor, a temperature sensor, a humidity sensor, and/or an illuminance sensor.

The interface 8277 may support one or more designated protocols that may be used by the electronic apparatus 8201 to directly or wirelessly connect with another electronic apparatus (the electronic apparatus 8202, etc.). The interface 8277 may include a High Definition Multimedia Interface (HDMI), a Universal Serial Bus (USB) interface, an SD card interface, and/or an audio interface.

The connection terminal 8278 may include a connector through which the electronic apparatus 8201 may be physically connected to another electronic apparatus (the electronic apparatus 8202, etc.). The connection terminal 8278 may include an HDMI connector, a USB connector, an SD card connector, and/or an audio connector (a headphone connector, etc.).

The haptic module 8279 may convert an electrical signal into a mechanical stimulus (vibration, movement, etc.) or an electrical stimulus that may be perceived by the user through tactile or kinesthetic sense. The haptic module 8279 may include a motor, a piezoelectric element, and/or an electrical stimulation device.

The camera module 8280 may capture still images and moving images. The camera module 8280 may include a lens assembly including one or more lenses, image sensors, image signal processors, and/or flashes. The lens assembly included in the camera module 8280 may collect light emitted from an object, an image of which is to be captured.

The power management module 8288 may manage power supplied to the electronic apparatus 8201. The power management module 8388 may be implemented as part of a Power Management Integrated Circuit (PMIC).

The battery 8289 may supply power to components of the electronic apparatus 8201. The battery 8289 may include a non-rechargeable primary cell, a rechargeable secondary cell, and/or a fuel cell.

The communication module 8290 may support the establishment of a direct (wired) communication channel and/or a wireless communication channel between the electronic apparatus 8201 and other electronic apparatuses (the electronic device 8202, the electronic device 8204, the server 8208, etc.) and performing communications through the established communication channel. The communication module 8290 may include one or more communication processors that operate independently from the processor 8220 (an application processor, etc.) and support direct communication and/or wireless communication. The communication module 8290 may include a wireless communication module 8292 (a cellular communication module, a short-range wireless communication module, and a Global Navigation Satellite System (GNSS) communication module, etc.) and/or a wired communication module 8294 (Local Area Network (LAN) communication module and a power line communication module, etc.). Among these communication modules, a corresponding communication module may communicate with other electronic apparatuses through the first network 8298 (a short-range communication network, such as Bluetooth, WiFi Direct, or Infrared Data Association (IrDA)) or the second network 8299 (a telecommunication network, such as a cellular network, the Internet, or a computer network (LAN) and WAN, etc.). The various types of communication modules may be integrated into one component (a single chip, etc.) or implemented as a plurality of components (plural chips) separate from each other. The wireless communication module 8292 may identify and authenticate the electronic apparatus 8201 within a communication network, such as the first network 8298 and/or the second network 8299 by using subscriber information (such as, International Mobile Subscriber Identifier (IMSI)) stored in a subscriber identification module 8296.

The antenna module 8297 may transmit or receive signals and/or power to and from the outside (other electronic devices, etc.). An antenna may include a radiator having a conductive pattern formed on a substrate (PCB, etc.). The antenna module 8297 may include one or a plurality of antennas. When a plurality of antennas are included in the antenna module 8297, an antenna suitable for a communication method used in a communication network, such as the first network 8298 and/or the second network 8299 from among the plurality of antennas may be selected by the communication module 8290. Signals and/or power may be transmitted or received between the communication module 8290 and another electronic apparatus through the selected antenna. In addition to the antenna, other components (a RFIC, etc.) may be included as part of the antenna module 8297.

Some of the components, between peripheral devices, may be connected to each other through communication methods (bus, General Purpose Input and Output (GPIO), Serial Peripheral Interface (SPI), Mobile Industry Processor Interface (MIPI), etc.) and signals (commands, data, etc.) may be interchangeable.

Commands or data may be transmitted or received between the electronic apparatus 8201 and the external electronic apparatus 8204 through the server 8208 connected to the second network 8299. The other electronic apparatuses 8202 and 8204 may be the same type as or different types from the electronic apparatus 8201. All or part of the operations executed in the electronic apparatus 8201 may be executed in one or more of the other electronic apparatuses 8202 and 8204 and server 8208. For example, when the electronic apparatus 8201 needs to perform a function or service, the electronic apparatus 8201 may request one or more other electronic devices to perform part or all of the function or service instead of executing the function or service itself. One or more other electronic apparatuses receiving the request may execute an additional function or service related to the request, and transmit a result of the execution to the electronic apparatus 8201. To this end, cloud computing, distributed computing, and/or client-server computing technologies may be used.

Figure 44:
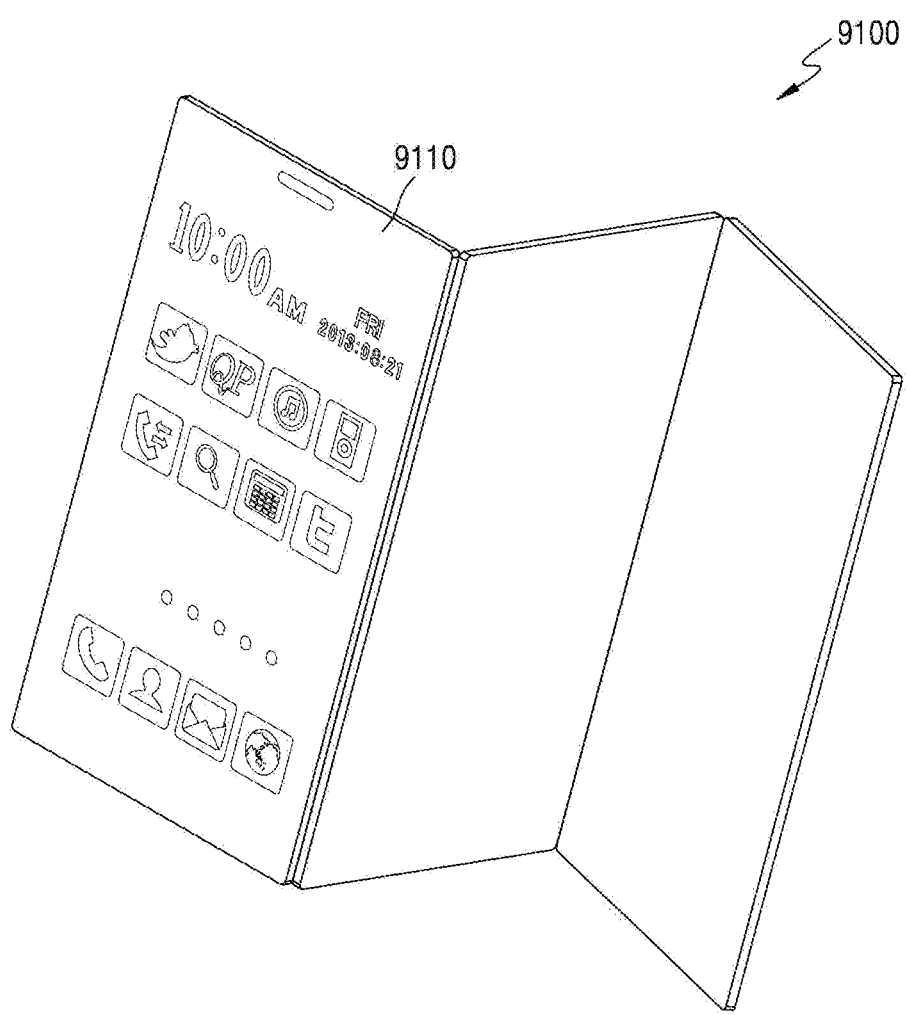
FIG. 44 is a diagram illustrating an example of applying an electronic apparatus according to an example embodiment to a mobile apparatus.

FIG. 44 is a diagram illustrating an example of applying an electronic apparatus according to an example embodiment to a mobile apparatus 9100.

Referring to FIG. 44, the mobile apparatus 9100 may include a display device 9110 according to an example embodiment. The display device 9110 may include a micro light-emitting element array. For example, the display device 9110 may include various types of display devices including the micro light-emitting element arrays 1200, 1300, 1400, and 1500 described with reference to FIGS. 15, 16, 17, and 19. The display device 9110 may have a foldable structure and, for example, may be applied to a multi-folder display. Here, although the mobile apparatus 9100 is illustrated as a foldable display, it may be applicable to a general flat panel display.

Figure 45:
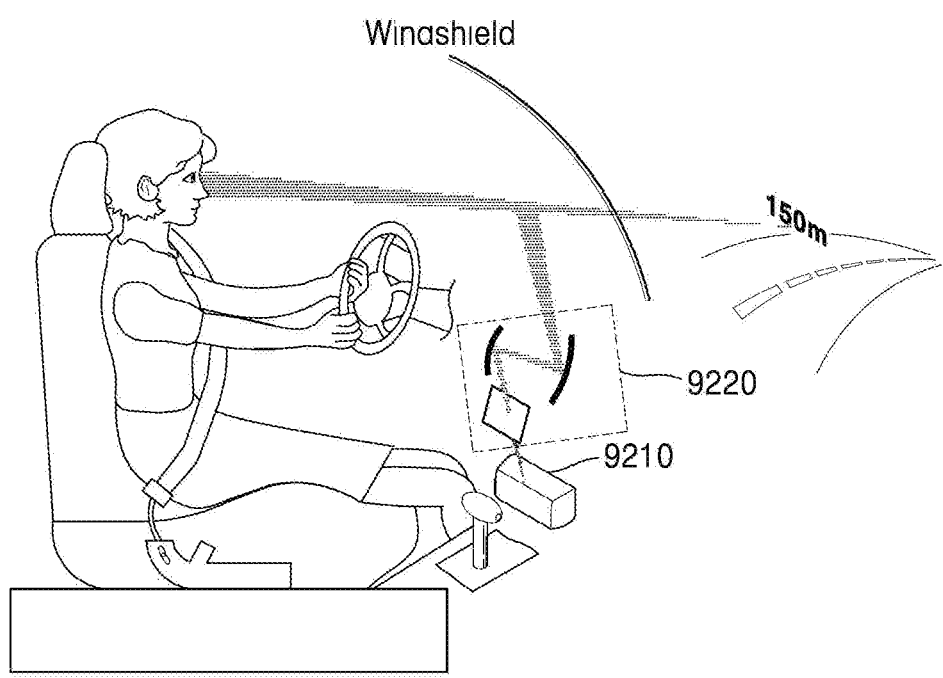
FIG. 45 is a diagram illustrating an example of applying a display device according to an example embodiment to a vehicle.

FIG. 45 is a diagram illustrating an example of applying a display device according to an example embodiment to a vehicle.

Referring to FIG. 45, a display device 9210 may be applied to a head-up display device for a vehicle. The head-up display device may include a display device 9210 provided in a region of a vehicle, and at least one light path changing member 9220 configured to convert a path of light so that a driver may see an image generated by the display device 9210. The display device 9210 may include a micro light-emitting element array. For example, the display device 9210 may include various types of display devices including the micro light-emitting element arrays 1200, 1300, 1400, and 1500 described with reference to FIGS. 15, 16, 17, and 19.

Figure 46:
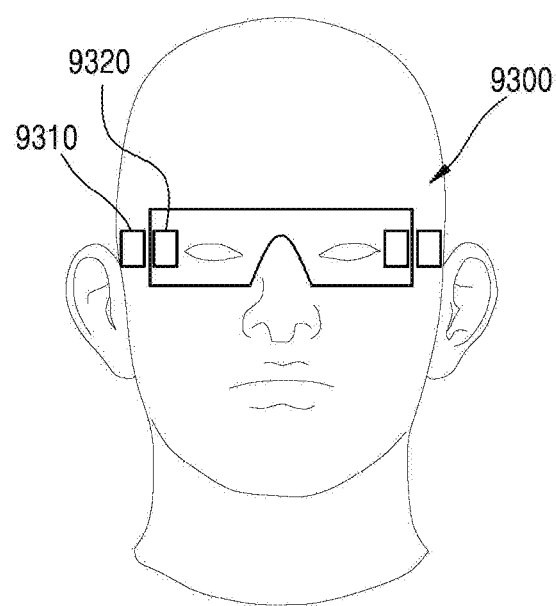
FIG. 46 is a diagram illustrating an example of applying a display device according to an example embodiment to augmented reality glasses.

FIG. 46 is a diagram illustrating an example of applying a display device according to an example embodiment to augmented reality glasses 9300.

Referring to FIG. 46, the augmented reality glasses 9300 may include a projection system 9310 configured to form an image and at least one element 9320 configured to guide the image from the projection system 9310 into user's eyes. The projection system 9310 may include an array of micro light-emitting elements. For example, the projection system 9310 may include various types of display devices including the micro light-emitting element arrays 1200, 1300, 1400, and 1500 described with reference to FIGS. 15, 16, 17, and 19. Similar to the augmented reality glasses 9300, virtual reality glasses including the projection system 9310 and the at least one element 9320 may be implemented.

Figure 47:
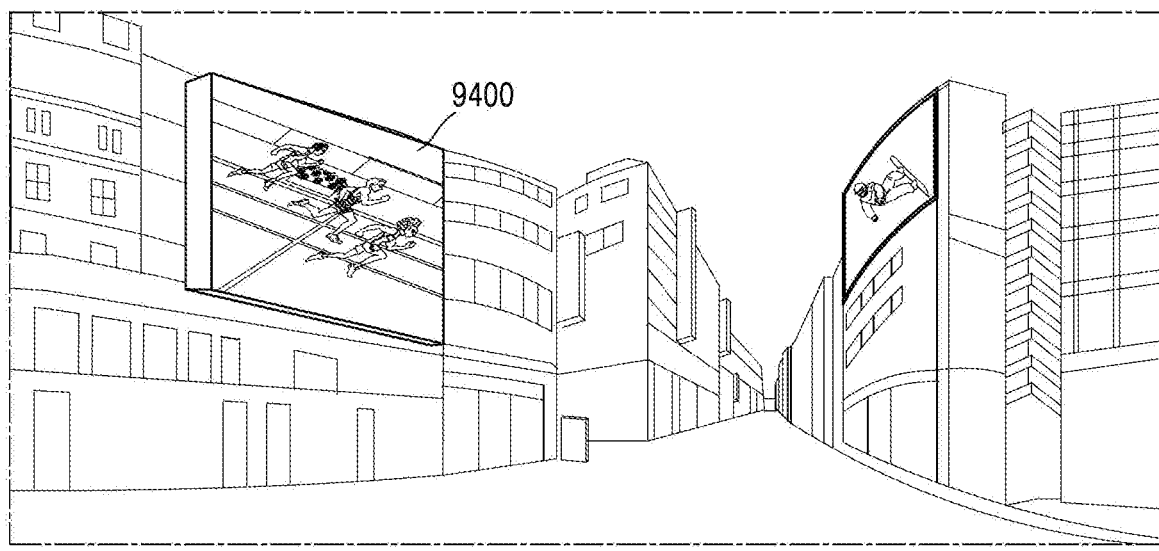
FIG. 47 illustrates an example of applying a display device according to an example embodiment to a large-sized signage.

FIG. 47 illustrates an example of applying a display device according to an example embodiment to a signage 9400 having a large size.

Referring to FIG. 47, the signage 9400 may be used for outdoor advertisement using a digital information display, and may control advertisement contents through a communication network. The signage 9400 may be implemented, for example, through the electronic apparatus 8201 described with reference to FIG. 43.

Figure 48:
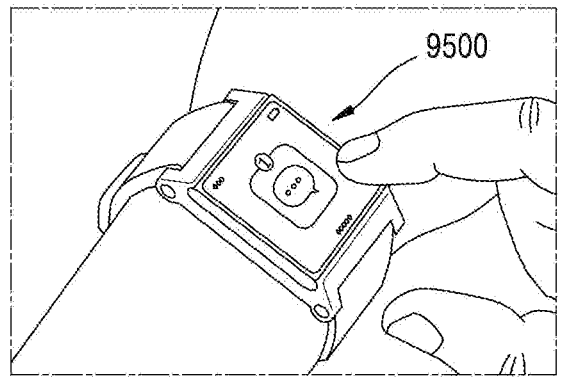
FIG. 48 is a diagram illustrating an example of applying a display device according to an example embodiment to a wearable display.

FIG. 48 is a diagram illustrating an example of applying a display device according to an example embodiment to a wearable display 9500.

Referring to FIG. 48, the wearable display 9500 may include various types of display devices including the micro light-emitting element arrays 1200, 1300, 1400, and 1500 described with reference to FIGS. 15, 16, 17, and 19 or may be implemented through the electronic apparatus 8201 described with reference to FIG. 43.

The display device according to the one or more example embodiments may also be applied to various products, such as a rollable TV and a stretchable display.

According to various embodiments of the disclosure, it is possible to provide a micro light-emitting element array that improves light extraction efficiency and simultaneously improves the transfer yield by increasing adhesion between the micro light-emitting element and a substrate. According to various embodiments of the disclosure, it is possible to provide a micro light-emitting element array that increases light extraction efficiency by forming an uneven pattern on one surface of each of a plurality of micro light-emitting elements and at the same time increase adhesion between the micro light-emitting element and a substrate by providing a flat transparent coating layer covering the uneven pattern, thereby improving the transfer yield.

It should be understood that embodiments described herein should be considered in a descriptive sense only and not for purposes of limitation.

Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light-emitting element comprising:
   a first conductivity type semiconductor layer including a lower surface on which an uneven pattern is formed, the lower surface of the first conductivity type semiconductor layer having a first surface roughness;
   an active layer provided on the first conductivity type semiconductor layer;
   a second conductivity type semiconductor layer provided on the active layer;
   at least one electrode provided on the second conductivity type semiconductor layer; and
   a transparent coating layer including a first surface covering the lower surface of the first conductivity type semiconductor layer, and a second surface on an opposite side of the first surface, the second surface having a second surface roughness that is less than the first surface roughness,
   wherein the transparent coating layer is an outermost layer of the micro light-emitting element.

2. The micro light-emitting element of claim 1, wherein the second surface roughness is 5 nm or less.

3. The micro light-emitting element of claim 1, wherein the transparent coating layer includes one of polyimide (PI), spin-on-glass (SOG), photoresist, silicon oxide, or silicon nitride.

4. The micro light-emitting element of claim 1, wherein the transparent coating layer has a light transmittance of 80% or more.

5. The micro light-emitting element of claim 1, wherein the transparent coating layer has a refractive index value between 1 and 2.

6. The micro light-emitting element of claim 1, wherein the first conductivity type semiconductor layer, the active layer, and the second conductivity type semiconductor layer each include one of GaN, InN, AlN, InGaN, AlGaN, InAlGaN, AlInN, AlGaAs, InGaAs, AlInGaAs, GaP, AlGaP, InGaP, AlInGaP, or InP.

7. The micro light-emitting element of claim 1, wherein a first electrode and a second electrode are provided on the second conductivity type semiconductor layer, and wherein the first electrode and the second electrode are spaced apart from each other.

8. The micro light-emitting element of claim 7, wherein the first electrode has a ring shape corresponding to an edge of the upper surface of the second conductivity type semiconductor layer, and
   wherein the second electrode is surrounded by the first electrode.

9. The micro light-emitting element of claim 1, wherein at least one of a plurality of nanobeads or a plurality of nanopores are formed inside the transparent coating layer.

10. The micro light-emitting element of claim 1, wherein an engraved nano-pattern is formed on the second surface of the transparent coating layer.

11. The micro light-emitting element of claim 1, wherein a cross-section of the transparent coating layer is a rectangular shape and an entirety of the first surface of the transparent coating layer facing the first conductivity type semiconductor layer contacts the first conductivity type semiconductor layer.

12. A micro light-emitting element comprising:
    a first conductivity type semiconductor layer including a lower surface on which an uneven pattern is formed, the lower surface of the first conductivity type semiconductor layer having a first surface roughness;
    an active layer provided on the first conductivity type semiconductor layer;
    a second conductivity type semiconductor layer provided on the active layer;
    at least one electrode provided on the second conductivity type semiconductor layer; and
    a transparent coating layer including a first surface covering an upper surface of the second conductivity type semiconductor layer, and a second surface on an opposite side of the first surface, the second surface having a second surface roughness that is less than the first surface roughness,
    wherein the transparent coating layer is an outermost layer of the micro light-emitting element.

13. The micro light-emitting element of claim 12, wherein a hole exposing at least a portion of the at least one electrode is formed in the second surface.

14. The micro light-emitting element of claim 12, wherein the transparent coating layer has a first thickness that is greater than a second thickness of the at least one electrode.

15. The micro light-emitting element of claim 11, wherein the second surface roughness is 5 nm or less.

16. A micro light-emitting element array comprising:
    a plurality of micro light-emitting elements, each of the plurality of micro light-emitting elements comprising:
       a micro light-emitting structure including a first surface on which an electrode is provided, and a second surface facing the first surface, the second surface including an uneven pattern having a first surface roughness, and
       a transparent coating layer including a third surface covering the second surface, and a fourth surface on an opposite side of the third surface, the fourth surface having a second surface roughness that is less than the first surface roughness, wherein the transparent coating layer is an outermost layer of the micro light-emitting element; and
    a substrate including an upper surface having a first region in which the plurality of micro light-emitting elements are provided and a second region surrounding the first region.

17. The micro light-emitting element array of claim 16, wherein the second surface roughness is 5 nm or less.

18. The micro light-emitting element array of claim 16, wherein the micro light-emitting structure included in each of the plurality of micro light-emitting elements includes a structure in which a first conductivity type semiconductor layer, an active layer, and a second conductivity type semiconductor layer are sequentially stacked, and wherein the first surface of the micro light-emitting structure is an upper surface of the second conductivity type semiconductor layer, and the second surface of the micro light-emitting structure is a lower surface of the first conductivity type semiconductor layer.

19. The micro light-emitting element array of claim 16, wherein the substrate includes a transfer substrate including a plurality of grooves formed in the upper surface of the substrate, and
each of the plurality of micro light-emitting elements is arranged so that the first surface of the micro light-emitting structure faces an upper opening of the plurality of grooves, and the fourth surface of the transparent coating layer is in contact with bottoms of the plurality of grooves.

20. The micro light-emitting element array of claim 16, wherein the substrate includes a transfer substrate including a plurality of hydrophilic regions formed on the upper surface of the substrate and a hydrophobic region surrounding the plurality of hydrophilic regions, and
wherein each of the plurality of micro light-emitting elements is arranged so that the fourth surface of the transparent coating layer is in contact with the plurality of hydrophilic regions.

21. The micro light-emitting element array of claim 16, wherein the substrate includes a driving circuit board including a plurality of grooves formed in the upper surface of the substrate and a plurality of electrode structures respectively provided in the plurality of grooves, and
wherein each of the plurality of micro light-emitting elements is arranged so that the electrode of each of the plurality of micro light-emitting elements provided on the first surface are respectively in contact with the plurality of electrode structures provided in the plurality of grooves, and the fourth surface faces upper openings of the plurality of grooves.

22. The micro light-emitting element array of claim 16, wherein the substrate includes a driving circuit board including a plurality of electrode structures respectively provided in a plurality of element regions separated from each other on the upper surface thereof, and
wherein each of the plurality of micro light-emitting elements is arranged so that the electrode of each of the plurality of micro light-emitting elements provided on the first surface is in contact with the plurality of electrode structures provided in the plurality of element regions.

23. A micro light-emitting element array comprising:
a plurality of micro light-emitting elements, each of the plurality of micro light-emitting elements comprising:
a micro light-emitting structure including a first surface on which an electrode is provided and a second surface facing the first surface, the second surface including an uneven pattern having a first surface roughness, and
a transparent coating layer including a third surface covering the first surface and a fourth surface on an opposite side of the third surface, the fourth surface having a second surface roughness that is less than the first surface roughness, wherein the transparent coating layer is an outermost layer of the micro light-emitting element; and
a substrate including an upper surface having a first region in which the plurality of micro light-emitting elements are provided and a second region surrounding the first region.

24. The micro light-emitting element array of claim 23, wherein a hole exposing at least a portion of the electrode is formed in the fourth surface.

25. The micro light-emitting element array of claim 23, wherein the substrate includes a driving circuit board including a plurality of grooves formed in the upper surface of the substrate and a plurality of electrode structures provided in the plurality of grooves, and
wherein each of the plurality of micro light-emitting elements is arranged so that the fourth surface faces the plurality of electrode structures provided in the plurality of grooves and the second surface faces upper openings of the plurality of grooves.

26. The micro light-emitting element array of claim 23, wherein the substrate includes a driving circuit board including a plurality of hydrophilic regions formed on the upper surface of the substrate, a hydrophobic region surrounding the plurality of hydrophilic regions, and a plurality of electrode structures provided in the plurality of hydrophilic regions, and
wherein each of the plurality of micro light-emitting elements is arranged so that the fourth surface faces the plurality of electrode structures provided in the plurality of hydrophilic regions.

27. A display device comprising:
a pixel array including a plurality of micro light-emitting elements;
a driving circuit configured to drive the pixel array; and
a processor configured to control the operation of the driving circuit;
wherein each of the plurality of micro light-emitting elements comprises:
a first conductivity type semiconductor layer including a lower surface on which an uneven pattern is formed, the lower surface of the first conductivity type semiconductor layer having a first surface roughness;
an active layer provided on the first conductivity type semiconductor layer;
a second conductivity type semiconductor layer provided on the active layer;
at least one electrode provided on the second conductivity type semiconductor layer; and
a transparent coating layer including a first surface covering the lower surface of the first conductivity type semiconductor layer, and a second surface on an opposite side of the first surface, the second surface having a second surface roughness that is less than the first surface roughness, wherein the transparent coating layer is an outermost layer of the micro light-emitting element.

28. The display device of claim 27, wherein the second surface roughness is 5 nm or less.

29. A display device comprising:
a pixel array including a plurality of micro light-emitting elements;
a driving circuit configured to drive the pixel array; and
a processor configured to control the operation of the driving circuit;
wherein each of the plurality of micro light-emitting element comprises:
a first conductivity type semiconductor layer including a lower surface on which an uneven pattern is formed, the lower surface of the first conductivity type semiconductor layer having a first surface roughness;

an active layer provided on the first conductivity type semiconductor layer;

a second conductivity type semiconductor layer provided on the active layer;

at least one electrode provided on the second conductivity type semiconductor layer; and a transparent coating layer including a first surface covering an upper surface of the second conductivity type semiconductor layer, and a second surface on an opposite side of the third surface, the fourth surface having a second surface roughness that is less than the first surface roughness, wherein the transparent coating layer is an outermost layer of the micro light-emitting element.

30. A micro light-emitting element comprising:

a first conductivity type semiconductor layer including a lower surface on which an uneven pattern is formed, the lower surface of the first conductivity type semiconductor layer having a first characteristic configured to apply a first Van der Waals force;

an active layer provided on the first conductivity type semiconductor layer;

a second conductivity type semiconductor layer provided on the active layer;

at least one electrode provided on the second conductivity type semiconductor layer; and a transparent coating layer including:
- a first surface covering one of the lower surface of the first conductivity type semiconductor layer or an upper surface of the second conductivity type semiconductor layer, and
- a second surface having a second characteristic configured to apply a second Van der Waals force greater than the first Van der Waals force, wherein the transparent coating layer is an outermost layer of the micro light-emitting element.

31. The micro light-emitting element of claim 30, wherein the first characteristic is a first surface roughness of the lower surface of the first conductivity type semiconductor layer, and the second characteristic is a second surface roughness of the second surface of the transparent coating layer.

* * * * *